US012772733B2

(12) United States Patent
Matsunaga et al.

(10) Patent No.: US 12,772,733 B2
(45) Date of Patent: Oct. 20, 2026

(54) LAMINATED THERMOELECTRIC CONVERSION ELEMENT AND METHOD FOR MANUFACTURING SAME

(71) Applicant: MITSUBISHI MATERIALS CORPORATION, Tokyo (JP)

(72) Inventors: Takuya Matsunaga, Saitama (JP); Toshiaki Fujita, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 19/129,062

(22) PCT Filed: Nov. 2, 2023

(86) PCT No.: PCT/JP2023/039551
§ 371 (c)(1),
(2) Date: May 12, 2025

(87) PCT Pub. No.: WO2024/106216
PCT Pub. Date: May 23, 2024

(65) Prior Publication Data

US 2026/0173757 A1 Jun. 18, 2026

(30) Foreign Application Priority Data

Nov. 16, 2022 (JP) ................................ 2022-183531
Oct. 26, 2023 (JP) ................................ 2023-184057

(51) Int. Cl.
*H10N 10/17* (2023.01)
*H10N 10/01* (2023.01)

(52) U.S. Cl.
CPC ............ *H10N 10/17* (2023.02); *H10N 10/01* (2023.02)

(58) Field of Classification Search
None
See application file for complete search history.

(56) References Cited

U.S. PATENT DOCUMENTS

2019/0044043 A1* 2/2019 Chikagawa .......... H10N 10/855

FOREIGN PATENT DOCUMENTS

CN 101867010 A * 10/2010 ............ H10W 40/28
JP H04-199755 A 7/1992
JP H11-121815 A 4/1999

(Continued)

*Primary Examiner* — Dustin Q Dam
(74) *Attorney, Agent, or Firm* — Troutman Pepper Locke LLP

(57) ABSTRACT

Provided is a laminated thermoelectric conversion element that improves power generation performance per unit area. A first laminate in which a P-type layer formed of a P-type thermoelectric conversion material, an N-type layer formed of an N-type thermoelectric conversion material, and a first insulating layer disposed between the P-type layer and the N-type layer are laminated, and first electrodes that electrically connect the P-type layer and the N-type layer are provided, the first laminate has a plurality of striped surfaces where end surfaces of the P-type layer, the N-type layer, and the first insulating layer are arranged and exposed in stripes, one of the striped surfaces is set for a high temperature side, a surface on the opposite side of the first striped surface is set as a low temperature side, and the first electrodes on at least one of a third striped surface.

20 Claims, 19 Drawing Sheets

(56) References Cited

FOREIGN PATENT DOCUMENTS

| | | | |
|---|---|---|---|
| JP | 2004-281928 | A | 10/2004 |
| JP | 2008-098197 | A | 4/2008 |
| JP | 2012-248819 | A | 12/2012 |

* cited by examiner

LAMINATED THERMOELECTRIC CONVERSION ELEMENT AND METHOD FOR MANUFACTURING SAME

TECHNICAL FIELD

The present invention relates to a laminated thermoelectric conversion element that enables power generation (thermoelectric power generation) by temperature difference through the Seebeck effect and electronic cooling/heat generation through the Peltier effect, using a P-type thermoelectric conversion material and an N-type thermoelectric conversion material, and a method for manufacturing the laminated thermoelectric conversion element. The present application claims priority based on Japanese Patent Application No. 2022-183531 filed on Nov. 16, 2022 in Japan and Japanese Patent Application No. 2023-184057 filed on Oct. 26, 2023 in Japan, the contents of which are incorporated herein by reference.

BACKGROUND ART

In the related art, in a so-called II-type thermoelectric conversion module, N-type and P-type thermoelectric conversion elements interposed between an insulating substrate on a low temperature side and an insulating substrate on a high temperature side are connected in series by electrodes to form a P-N junction pair.

CITATION LIST

Patent Literature

[PTL 1] JP-A-2012-248819 (FIGS. 1 and 2)

SUMMARY OF INVENTION

Technical Problem

For example, in the power generation using the Seebeck effect from low-temperature waste heat of 200° C. or lower, a Seebeck coefficient of a $Bi_2Te_3$-based element, which is a thermoelectric material that is generally used, is about 200 μV/K. In order to increase a voltage obtained in a thermoelectric conversion module having a predetermined size, the number of N-type and P-type thermoelectric conversion elements per unit area of the insulating substrate in contact with a heat source may be increased. However, in the structure disclosed in FIG. 1 of PTL 1, it is necessary to provide a gap for insulation between the electrodes, and thus the number of thermoelectric conversion elements that can be installed in the thermoelectric conversion module is limited.

In order to increase the number of N-type and P-type thermoelectric conversion elements in the thermoelectric conversion module, PTL 1 proposes a method for manufacturing a thermoelectric conversion element by sandwiching an insulating material between P-type and N-type thermoelectric conversion materials and integrally sintering the materials at a temperature higher than 1,000° C. In this method, electrodes of a plurality of P-N junction pairs are provided in an upper portion and a lower portion of the thermoelectric conversion element so that the P-N junction pairs are connected in series. The thermoelectric conversion element is joined to each insulating substrate through the electrodes.

In the thermoelectric conversion element in FIG. 1 of PTL 1, the electrodes provided in a part of the upper and lower surfaces are joined to the insulating substrate on the heat source side. In other words, the thermoelectric conversion material is not in direct contact with each heat source (insulating substrate). Therefore, a heat flow passes through the P-type and N-type thermoelectric conversion materials through the electrodes, and thus a temperature difference between the upper and lower surfaces is small. In this case, even in a case where the number of N-type and P-type thermoelectric conversion elements (thermoelectric materials) per unit area of the insulating substrate can be increased, there is a concern that a sufficient power generation amount may not be obtained.

The thermoelectric conversion element in FIG. 2 of PTL 1 has a configuration in which no electrodes are required due to direct joining between the P-type thermoelectric conversion material and the N-type thermoelectric conversion material with an insulating material interposed therebetween. However, since each thermoelectric conversion material is not formed with a uniform thickness, there is a concern that peeling may occur at each joining portion between the thermoelectric conversion material and the insulating material due to thermal expansion or the like caused by a change in temperature.

Therefore, an object of the present invention is to provide a laminated thermoelectric conversion element that improves power generation performance per unit area, and a method for manufacturing the laminated thermoelectric conversion element.

Solution to Problem

A laminated thermoelectric conversion element of the present invention is a laminated thermoelectric conversion element including: at least one first laminate in which at least one P-type layer formed of a P-type thermoelectric conversion material, at least one first insulating layer adjacent to the P-type layer, and at least one N-type layer formed of an N-type thermoelectric conversion material adjacent to the first insulating layer are laminated; and a first electrode that electrically connects the P-type layer and the N-type layer, in which the first laminate has a plurality of striped surfaces where end surfaces of the P-type layer, the N-type layer, and the first insulating layer are arranged and exposed in stripes, one of the striped surfaces is set as a first striped surface for a high temperature side, a surface on an opposite side of the first striped surface is set as a second striped surface for a low temperature side, and two striped surfaces other than the first striped surface and the second striped surface are set as a third striped surface and a fourth striped surface, respectively, and the first electrode is provided on at least one of the third striped surface or the fourth striped surface.

In the laminated thermoelectric conversion element, the P-type layer and the N-type layer are electrically connected by the first electrode provided on the third striped surface.

In the thermoelectric conversion module (FIG. 1 of PTL 1) of the related art, the I-type thermoelectric conversion element is joined to a high temperature-side substrate and a low temperature-side substrate through a plurality of electrodes formed to be smaller than the upper end surface and the lower end surface, and a gap is provided between the electrodes. Therefore, the density of the elements implemented on the area of the high temperature-side substrate or the area of the low temperature-side substrate of the thermoelectric conversion module of the related art is low, and it is difficult to sufficiently increase the element density per unit area.

In the laminated thermoelectric conversion element, since the first electrode is provided on the third striped surface, the first striped surface and the second striped surface facing each other can be brought into contact with surfaces of objects (high temperature side, low temperature side) such as ceramic substrates, which perform heat transfer. Therefore, in using in the thermoelectric conversion module, the density of the thermoelectric conversion materials (P-type layer and N-type layer) implemented on the surface of the object can be sufficiently increased, and the power generation voltage (output voltage density) per unit area of the thermoelectric conversion element increase.

In other words, in the laminated thermoelectric conversion element of the present invention, in the first laminate in which the P-type layers and the N-type layers are alternately laminated with the first insulating layer interposed therebetween, a first striped surface where end surfaces of the first insulating layer, the P-type layer, and the N-type layer are alternately arranged, a second striped surface that is an opposite surface of the first striped surface, a third striped surface and a fourth striped surface between the first striped surface and the second striped surface are formed, and a first electrode that electrically connects the P-type layer and the N-type layer is provided on the third striped surface or the fourth striped surface. Therefore, the first striped surface and the second striped surface where the electrode is not provided can be brought into contact with a heat source, the temperature difference between the first striped surface and the second striped surface can be efficiently increased, and thus a thermoelectric conversion element having good thermoelectric conversion efficiency can be obtained.

In the laminated thermoelectric conversion element, preferably, in the first laminate, a plurality of the P-type layers plurality of the N-type layers are alternately laminated with the first insulating layer interposed therebetween, and a plurality of the first electrodes electrically connect the plurality of P-type layers and the plurality of N-type layers in series.

Since the first laminate is configured so that a plurality of the P-type layers and a plurality of the N-type layers are laminated without a gap, the thermoelectric conversion materials (P-type layer and N-type layer) can be disposed at a high density on the surface of the object performing heat transfer.

In the laminated thermoelectric conversion element, preferably, the plurality of first electrodes are provided on the third striped surface and the fourth striped surface. Due to this structure, since the first electrodes can be appropriately disposed on the third striped surface and the fourth striped surface on the opposite side, the space efficiency can be further improved and the output voltage density can be increased.

In the laminated thermoelectric conversion element, preferably, a second laminate that includes a plurality of the first laminates arranged in a direction perpendicular to the third striped surface and a second insulating layer disposed between the plurality of first laminates, and a second electrode that is provided on a surface other than the striped surfaces of the two first laminates adjacent to each other through the second insulating layer to connect the P-type layer of one of the first laminates and the N-type layer of the other first laminate are provided.

In other words, in the laminated thermoelectric conversion element, preferably, a plurality of the first laminates are laminated through the second insulating layer with the third striped surface and the fourth striped surface facing each other, and the adjacent first laminates are connected in series by the second electrode that does not come into contact with the second insulating layer and is provided on a surface that is not a striped surface.

In the laminated thermoelectric conversion element, preferably, a third laminate in which a plurality of the first laminates arranged in a direction perpendicular to the first striped surface, and a first heat transfer layer that is disposed between the plurality of first laminates and that has electrical insulating properties are laminated is provided.

By arranging a plurality of the first laminates in a direction perpendicular to the third striped surface and in a direction perpendicular to the first striped surface, the thermoelectric conversion materials (P-type layer and N-type layer) can be disposed at a high density on the surface of the object (high temperature side, low temperature side) performing heat transfer.

In the laminated thermoelectric conversion element, preferably, the laminated thermoelectric conversion element has a rectangular parallelepiped shape, and the first striped surface and the second striped surface are orthogonal to the third striped surface.

In the laminated thermoelectric conversion element, preferably, a thickness of the first insulating layer in a lamination direction is 500 μm or less.

In a case where the laminated thermoelectric conversion element is used in the thermoelectric conversion module, since the voltage that is applied to the entire module is about several volts, the first insulating layer is sufficiently insulated even in a case where a thickness of the first insulating layer is 500 μm or less. As the first insulating layer is thinner, the density of the thermoelectric conversion materials (P-type layer and N-type layer) implemented on the surface of the object such as a ceramic substrate in the thermoelectric conversion module can be increased.

A thickness of the first insulating layer in a lamination direction may be equal to or less than half of an average value of thicknesses of the P-type layer and the N-type layer in the lamination direction.

In each laminated thermoelectric conversion element, the thickness of the first insulating layer between the P-type layer and the N-type layer is desirably 10 μm or more. In a case where the thickness is less than 10 μm, there is a possibility of insulation breakdown in a case where the electromotive force becomes large.

In the laminated thermoelectric conversion element, the first insulating layer may be any one of a resin, ceramics, or glass. The thermal conductivity of the insulating layer is 10 W/mK or lower, that is lower than those of the P-type layer and the N-type layer, and is desirably 5 W/mk or lower. In addition, the electric resistivity of the insulating layer is 100 times or more those of the P-type layer and the N-type layer or 0.1 Ωm or more, and is desirably 1 Ωm or more.

In the laminated thermoelectric conversion element, a second heat transfer layer having electrical insulating properties may be disposed on the first striped surface and the second striped surface. In this case, due to the second heat transfer layer, it is possible to efficiently transfer heat to the contact targets on the high temperature side and the low temperature side, and the output voltage of the thermoelectric conversion element can be improved.

In the laminated thermoelectric conversion element, in the second laminate, the first electrode may be disposed between the first laminate and the second insulating layer. In other words, in each first laminate laminated on the outermost side of the second laminate, the first electrode may be disposed to face inward.

In this case, the first electrode disposed to face inward is in contact with the second insulating layer and does not come into contact with the electrode of the adjacent first laminate. Due to this structure, the first electrode connecting each first laminate is not exposed to the atmosphere, and thus the humidity resistance of the thermoelectric conversion element can be improved. In a case where the electrode is made of Ag, the influence of ion migration can be reduced. In addition, in a case where the electrode surfaces are close to each other, an insulating layer may be provided therebetween.

In the laminated thermoelectric conversion element, an insulating coating that covers the second laminate and the second electrode may be further provided. In this case, it is possible to more effectively prevent the element and the electrode from being oxidized.

A method for manufacturing the laminated thermoelectric conversion element of the present invention includes: a laminate formation step of forming the first laminate by laminating a P-type plate material formed of the P-type thermoelectric conversion material, the first insulating layer adjacent to the P-type plate material, and an N-type plate material formed of the N-type thermoelectric conversion material and adjacent to the first insulating layer; and a first electrode formation step of providing the first electrode on the third striped surface of the first laminate.

In the method for manufacturing the laminated thermoelectric conversion element, the first laminate is configured in which the P-type layer and the N-type layer are integrated through the first insulating layer without providing a gap, and thus the element can be manufactured with an increased density of the thermoelectric conversion materials (P-type layer and N-type layer).

A method for manufacturing the laminated thermoelectric conversion element of the present invention includes: a joined body for division formation step of forming a joined body for division by laminating a P-type plate material formed of the P-type thermoelectric conversion material, the first insulating layer adjacent to the P-type plate material, and an N-type plate material formed of the N-type thermoelectric conversion material and adjacent to the first insulating layer; a first electrode formation step of forming an electrode-attached joined body for division by forming a plurality of electrodes ranging from the P-type plate material to the N-type plate material on a side surface of the joined body for division where the layers are exposed; and a division step of dividing the electrode-attached joined body for division to manufacture a plurality of the first laminates including the first electrodes.

In the method for manufacturing the laminated thermoelectric conversion element, a joined body for division (joined body having large area) having a laminated structure in which the first insulating layer is disposed between the P-type layer and the N-type layer is produced, and thus a plurality of electrodes are easily arranged on a side surface of the joined body for division using a method such as printing. The method for dividing the electrode-attached joined body for division is not limited. For example, a plurality of laminated thermoelectric conversion elements can be manufactured by arranging a plurality of electrodes on any side surface of the joined body for division and a side surface opposite to the side surface, dividing the electrode-attached joined body for division between both the side surfaces, and further subdividing the divided pieces. By dividing the electrode-attached joined body for division in this way, productivity is improved.

In the manufacturing method, in the division step, the first electrodes may be cut together with the electrode-attached joined body for division.

Advantageous Effects of Invention

According to the present invention, a contact area of the thermoelectric conversion materials (P-type layer and N-type layer) relative to surfaces of objects (high temperature side, low temperature side) such as ceramic substrates is increased, so that a heat flow passing through the thermoelectric conversion materials (P-type layer and N-type layer) increases, and the output voltage density can be increased compared to the thermoelectric conversion module (FIG. 1 of PTL 1) of the related art.

In addition, in the I-type thermoelectric conversion module of the related art in which a gap is provided between electrodes on a high temperature-side substrate, a method for filling the gap with a resin has been proposed as a measure against corrosion of the electrode. However, in the laminated thermoelectric conversion element of the present invention, since the electrodes are provided on the side surface, a treatment for corrosion of the electrode is easily performed.

Furthermore, since the P-type layer and the N-type layer are laminated with the first insulating layer disposed therebetween, it is possible to prevent the P-type layer and the N-type layer from being peeled off.

DESCRIPTION OF EMBODIMENTS

Hereinafter, embodiments of the present invention will be described with reference to the drawings.

First Embodiment

Figure 1:
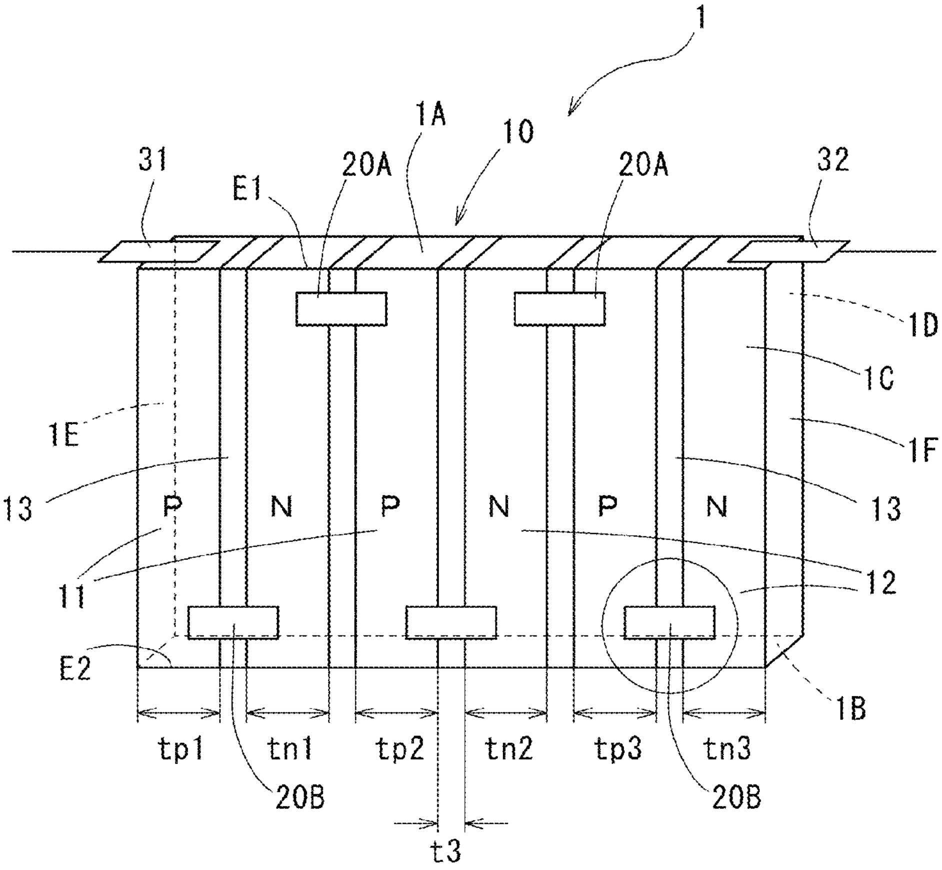
FIG. 1 is a perspective view showing a laminated thermoelectric conversion element according to a first embodiment of the present invention.

As shown in FIG. 1, a laminated thermoelectric conversion element 1 includes a first laminate 10 and a plurality of first electrodes 20A and 20B attached to the first laminate 10. The reference sign 20A denotes a first electrode provided on the upper side in FIG. 1, and the reference sign 20B denotes a first electrode provided on the lower side.

The first laminate 10 includes a plurality (three in the present embodiment) of P-type layers 11 formed of a P-type thermoelectric conversion material, a plurality (three in the present embodiment) of N-type layers 12 formed of an N-type thermoelectric conversion material, and a plurality (five in the present embodiment) of first insulating layers 13 each disposed between the P-type layer 11 and the N-type layer 12. In the first laminate 10, the plurality of P-type layers 11 and the plurality of N-type layers 12 are alternately laminated with the first insulating layer 13 disposed therebetween.

The first laminate 10 has a rectangular parallelepiped shape, and its surface includes four striped surfaces 1A to 1D where end surfaces of the layers (P-type layers 11, N-type layers 12, and first insulating layers 13) are arranged and exposed in stripes, and two non-striped surfaces 1E and 1F where a flat surface of any one of the P-type layer 11 or the N-type layer 12 is exposed.

Hereinafter, one of the striped surfaces is set as a first striped surface 1A for a high temperature side, a surface opposite to the first striped surface 1A is set as a second striped surface 1B for a low temperature side, and the remaining two striped surfaces are set as a third striped surface 1C and a fourth striped surface 1D, respectively. In FIG. 1, the description will be made by setting the first striped surface 1A of the first laminate 10 as an upper end and the second striped surface 1B as a lower end. In the first laminate 10, the third striped surface 1C, one non-striped surface 1E, the fourth striped surface 1D, and the other non-striped surface 1F are connected in this order in a circumferential direction of the first laminate 10, and these may be collectively referred to as a side surface of the first laminate 10. In the drawings, the P-type layer 11 is denoted by "P", and the N-type layer 12 is denoted by "N".

In the first laminate 10, the plurality of P-type layers 11 each function as one P-type element, and hereinafter, the P-type layer may be referred to as a P-type element. Similarly, the N-type layer may be referred to as an N-type element.

(P-Type Layer 11 and N-Type Layer 12)

The P-type layer 11 and the N-type layer 12 each are formed of, for example, a sintered body of a tellurium compound, skutterudite, filled skutterudite, Heusler, half-Heusler, clathrate, silicide, an oxide, silicon germanium, or the like. It is noted that there are compounds that can exhibit both P-type and N-type properties depending on the dopant, and compounds having only one of the P-type properties and N-type properties.

As the P-type thermoelectric conversion material, $Bi_2Te_3$, $Sb_2Te_3$, PbTe, TAGS(=Ag—Sb—Ge—Te), $Zn_4Sb_3$, $CoSb_3$, $CeFe_4Sb_{12}$, $Yb_{14}MnSb_{11}$, FeVAl, $MnSi_{1.73}$, $FeSi_2$, $NaxCoO_2$, $Ca_3Co_4O_7$, $Bi_2Sr_2Co_2O_7$, SiGe, $Mn_{0.93}V_{0.03}Fe_{0.04}Si_{1.7}$, a P-type half-Heusler (HH) element (Sn 50 at %-Ni 25 at %-Zr 10 at %-Ti 15 at %), and the like are used. The P-type thermoelectric conversion material has a Seebeck coefficient of 100 μV/K, an electric conductivity of 3,500 S/cm, and a thermal conductivity of 5.5 W/mK.

As the N-type thermoelectric conversion material, $Bi_2Te_3$, PbTe, $LasTe_4$, $CoSb_3$, FeVAl, ZrNiSn, $BasAl_{16}Si_{30}$, $Mg_2Si$, $Mg_2Si_x Sn_{1-x}$ (where x=0 to 1), $FeSi_2$, $SrTiO_3$, $CaMnO_3$, Zno, SiGe, an N-type half-Heusler (HH) element (Sb 45 at %-Fe 20 at %-Nb 25 at %-Ti 5 at %-V 5 at %), and the like are used. The N-type thermoelectric conversion material has a Seebeck coefficient of −150 μV/K, an electric conductivity of 1,500 S/cm, and a thermal conductivity of 5.5 W/mK.

For example, as for each of the P-type layer 11 formed of manganese silicide and the N-type layer 12 formed of magnesium silicide, a mother alloy is pulverized with a ball mill to produce, for example, a pulverized powder having a particle diameter of 75 μm or less, and then the pulverized powder is sintered by spark plasma sintering, hot pressing, or a hot isostatic pressing method to produce, for example, a square plate-shaped bulk material.

In the first laminate 10, thicknesses tp1 to tp3 of the P-type layers 11 and thicknesses tn1 to tn3 of the N-type layers 12 are set to be the same in a lamination direction.

Figure 2:
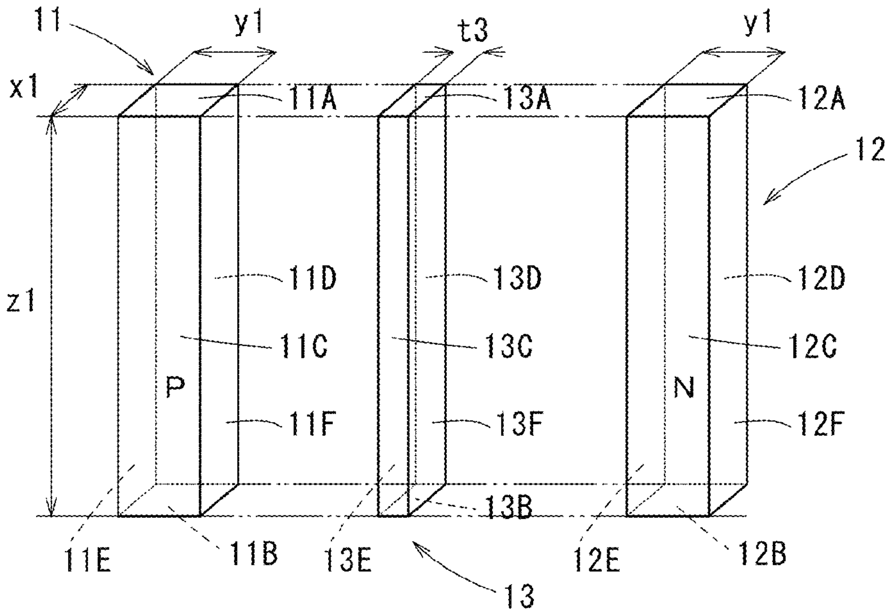
FIG. 2 is a perspective view showing a P-type element (N-type element) and a first insulating layer constituting the laminated thermoelectric conversion element of FIG. 1.

Each of the P-type layer 11 and the N-type layer 12 has a rectangular parallelepiped shape as shown in FIG. 2.

The P-type layer 11 has four end surfaces that form the surface of the first laminate 10. One of the four end surfaces is a rectangular end surface 11A for a high temperature side, a surface opposite to the end surface 11A is an end surface 11B for a low temperature side, and the remaining two end surfaces are end surfaces 11C and 11D that extend in parallel between the end surface 11A for a high temperature side and the end surface 11B for a low temperature side. Like the P-type layer 11, the N-type layer 12 also has an end surface 12A for a high temperature side, an end surface 12B for a low temperature side opposite to the end surface 12A, and two end surfaces 12C and 12D that extend in parallel between the end surface 12A and the end surface 12B.

In addition, the P-type layer 11 has flat surfaces 11E and 11F provided adjacent to the four end surfaces 11A, 11B, 11C, and 11D for joining to the first insulating layer 13, and the flat surfaces 11E and 11F are fully joined to the first insulating layer 13. The N-type layer 12 also has flat surfaces 12E and 12F provided for joining to the first insulating layer 13, like the P-type layer 11. In a case where the flat surfaces 11E, 11F, 12E, and 12F are not joined to the first insulating layer 13, they form the outer surface of the first laminate 10.

In the P-type layer 11 and the N-type layer 12, preferably, dimensions z1 between the end surfaces 11A and 12A for a high temperature side and the end surfaces 11B and 12B for a low temperature side are set to be larger than dimensions of sides of the rectangular end surfaces 11A, 11B, 12A, and 12B for a high temperature side (for a low temperature side)×1 (tp1 to tp3, tn1 to tn3) and y1, and the end surfaces 11C, 11D, 12C, and 12D are formed to be larger than the end surfaces 11A, 11B, 12A, and 12B. Hereinafter, the z1 direction shown in FIG. 2 is referred to as a longitudinal direction of the P-type layer 11 and the N-type layer 12, and the y1 direction is referred to as a lamination direction.

In order to prevent the P-type layer 11 and the N-type layer 12 in the first laminate 10 from being peeled off, the first laminate 10 may be configured to satisfy any one or a combination of the following additional conditions 1 to 4, in addition to the P-type layer 11 and the N-type layer 12 having the flat surfaces 11E, 11F, 12E, and 12F for joining to the first insulating layer 13.

Additional Condition 1: The thermal expansion coefficient of the P-type layer 11 and the thermal expansion coefficient of the N-type layer 12 substantially match each other.

Additional Condition 2: The thermal expansion coefficients of the first electrodes 20A and 20B and the thermal expansion coefficients of the P-type layer 11 and the N-type layer 12 substantially match each other.

Additional Condition 3: The thermal expansion coefficient of the first insulating layer 13 and the thermal expansion coefficients of the P-type layer 11 and the N-type layer 12 substantially match each other.

Additional Condition 4: The P-type layer 11 and the N-type layer 12 do not react with the first electrodes 20A and 20B to generate voids or the like.

(First Insulating Layer 13)

The first insulating layer 13 is formed of any one of a resin, ceramics, or glass, and has four end surfaces 13A, 13B, 13C, and 13D that form the surface of the first laminate 10, and flat surfaces 13E and 13F that are joined to the P-type layer 11 or the N-type layer 12, as shown in FIG. 2.

It is desirable that the resin be a low-thermal-conductivity material such as a heat-resistant resin, and for example, a polyimide resin, a polyamide resin, a polyamideimide resin, or an epoxy resin can be used. As the ceramics, for example, pottery, porcelain, steatite, cordierite, forsterite, mullite, macerite, Macor, Photoveel, zirconia, titania, yttria, alumina, silicon nitride, and the like can be used.

The physical property values of the first insulating layer 13 are as follows.

Thermal Conductivity

The thermal conductivity of the first insulating layer 13 is 10 W/mK or less, that is lower than that of a thermoelectric conversion material, and is desirably 5 W/mK or less.

Electric Resistivity

The electric resistivity of the first insulating layer 13 is 100 times or more that of a thermoelectric conversion material or 0.1 Ωm or more, and is desirably 1 Ωm or more.

Although depending on the size of the laminated thermoelectric conversion element 1, the first insulating layer 13 is formed so that a thickness t3 in the lamination direction is equal to or less than at least one of the following value v1 or value v2. The thickness t3 of the first insulating layer 13 is preferably equal to or less than each of the value v1 and the value v2.

Value v1: 500 μm

Value v2: a value obtained by halving an average value of the thicknesses (tp1 to tp3, tn1 to tn3) of the P-type thermoelectric conversion materials (P-type layers 11) and the N-type thermoelectric conversion materials (N-type layers 12) in the lamination direction As shown in FIG. 1, in a case where the first laminate 10 is formed of three P-type layers 11 (having thicknesses tp1, tp2, and tp3, respectively) and three N-type layers 12 (having thicknesses tn1, tn2, and tn3, respectively), the value v2 is ((tp1+tp2+tp3+tn1+tn2+tn3)/6)/2.

Since a voltage that is applied to thermoelectric conversion modules 300, 300A, and 300B to be described later s about several volts, the thickness t3 of the first insulating layer 13 can be set to, for example, about 10 μm, and is preferably 10 μm or more.

In the laminated thermoelectric conversion element 1, the thermal flow flowing through the first insulating layer 13 is preferably reduced. Since the heat flow rate is proportional to the thermal conductivity, it is desirable to use a first insulating layer 13 having a low thermal conductivity.

In the first laminate 10, the end surfaces 11A, 12A, and 13A of the P-type layer 11, the N-type layer 12, and the first insulating layer 13 are connected in a flush manner to form the first striped surface 1A, the end surfaces 11B, 12B, and 13B of the P-type layer 11, the N-type layer 12, and the first insulating layer 13 are connected in a flush manner to form the second striped surface 1B, the end surfaces 11C, 12C, and 13C of the P-type layer 11, the N-type layer 12, and the first insulating layer 13 are connected in a flush manner to form the third striped surface 1C, and the end surfaces 11D, 12D, and 13D of the P-type layer 11, the N-type layer 12, and the first insulating layer 13 are connected in a flush manner to form the fourth striped surface 1D.

In the first laminate 10, the thermoelectric conversion material (P-type layer 11 or N-type layer 12) positioned on the outermost side (both ends) in the lamination direction forms an outermost layer, and two outermost layers are formed. One outermost layer forms the non-striped surface 1E and the other outermost layer forms the non-striped surface 1F.

In a case where the first insulating layer 13 is formed of a thick resin in the first laminate 10, the laminated thermoelectric conversion element 1 is flexible and can be formed as a flexible thermoelectric conversion element.

Figure 4:
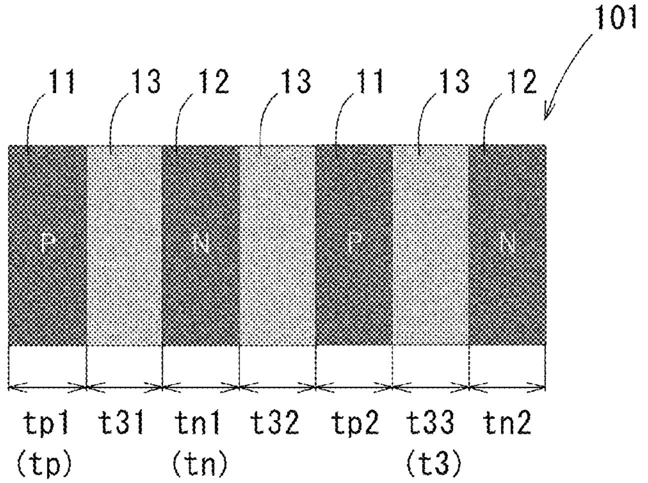
FIG. 4 is a diagram showing a state before deformation of a first laminate of the laminated thermoelectric conversion element according to the first embodiment of the present invention.

For example, a first laminate 101 shown in FIG. 4 includes two P-type layers 11 and two N-type layers 12, and a first insulating layer 13 is disposed between the P-type layer 11 and the N-type layer 12. A value (=(tp1+tp2+tn1+tn2)/4) obtained by averaging the thicknesses of the P-type layers 11 and the N-type layers 12 is denoted by tpn, and the thicknesses (t31, t32, t33) of the first insulating layers 13 are denoted by t3. The thickness t3 of the first insulating layer 13 is set as in Expression (1).

$$tpn/2 \leq t3 \leq tpn \times 2 \quad (1)$$

Figure 5:
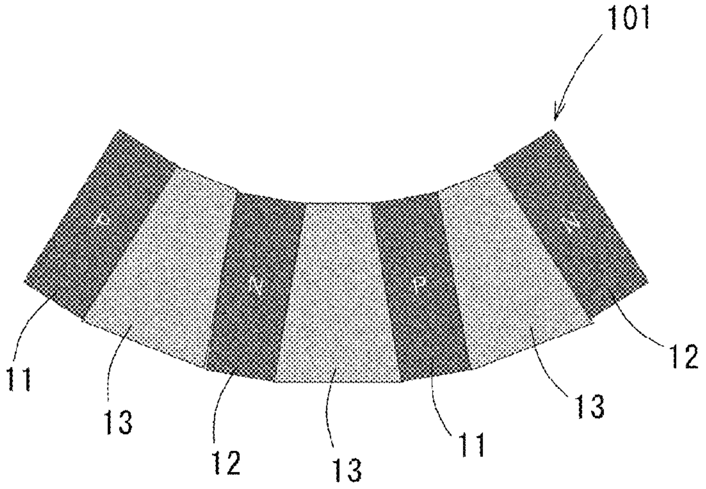
FIG. 5 is a diagram showing a state after deformation of the first laminate of FIG. 4.

In a case where the thickness t3 of each first insulating layer 13 is equal to or more than half of the average thickness tpn of the P-type layers 11 and the N-type layers 12 and is equal to or less than twice the average thickness tpn of the P-type layers 11 and the N-type layers 12, the first laminate 101 can be bent as shown in FIG. 5.

For example, the first insulating layer 13 can be formed of a polyimide resin having a heat resistant temperature of 260° C. or lower. The upper limit of the temperature at which the flexible thermoelectric conversion element is usable varies depending on the heat resistant temperature of the resin. The upper limit of the heat resistant temperature is a temperature lower than the softening temperature (glass transition point Tg) of a polymer, and is the upper limit of the temperature at which a polymer material is usable.

In addition, in a case where the first insulating layer 13 and the P-type layer 11 are joined and the first insulating layer 13 and the N-type layer 12 are joined using a pressure sensitive adhesive (not shown), the pressure sensitive adhesive can be used at a temperature equal to or lower than a lower one of the heat resistant temperature of the pressure sensitive adhesive and the heat resistant temperature of the first insulating layer 13.

In such a flexible thermoelectric conversion element, in a case where the thermal expansion coefficient of the first insulating layer 13 is different from those of the P-type layer 11 and the N-type layer 12 and the first insulating layer 13 is a resin, thermal stress is relaxed and it is possible to suppress the occurrence of peeling of the P-type layer 11 and the N-type layer 12 due to the difference in thermal expansion coefficient from the first insulating layer 13.

In the following description, the description will proceed based on the configuration of the first laminate 10 in FIG. 1.

(First Electrodes 20A and 20B)

The first electrodes 20A and 20B are provided on the third striped surface 1C among the side surfaces of the first laminate 10, where the end surfaces of the layers are exposed. The first electrode 20A is provided close to an edge E1 of the first striped surface 1A, and the first electrode 20B is provided close to an edge E2 of the second striped surface 1B.

Each of the upper first electrode 20A and the lower first electrode 20B is formed to range from the P-type layer 11 to the N-type layer 12 provided laterally with one first insulating layer 13 disposed between. The upper first electrodes 20A and the lower first electrodes 20B electrically connect the P-type layers 11 and the N-type layers 12 in series in an alternating manner.

The upper electrode 20A is away from the edge E1 of the first striped surface 1A, and a part of the third striped surface 1C is provided between the upper electrode 20A and the edge E1.

The first electrodes 20A and 20B are formed of Cu, Ag, Al, Ni, Au, Pt, Pd, Ti, V, Bi, Fe, Cr, Ta, W, Mo, In, or Zn, or an alloy containing one or more of the elements, and Cu with a low electric resistivity is preferably used.

It is desirable that the first electrodes 20A and 20B correspond to 10% or less of the electric resistance of one P-type element or one N-type element constituting the first laminate 10.

For example, in a case where a P-type element (N-type element) having a rectangular parallelepiped shape as shown in FIG. 2 is provided using a raw material $Bi_2Te_3$ with dimensions of end surfaces 11A and 12A set to 3 mm in vertical direction (x1), 3 mm in horizontal direction (y1), and 5 mm in length (z1) and the electric resistivity is set to about $1.0\times10^{-5}$ [Ωm], the electric resistance of the P-type element (N-type element) is 5.5 mΩ.

Figure 3:
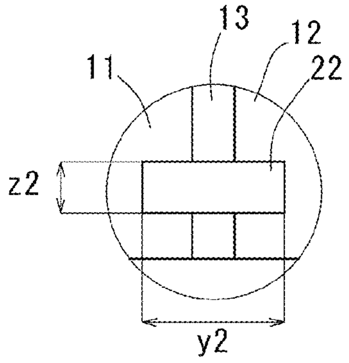
FIG. 3 is an enlarged view of a part surrounded by a circle in FIG. 1.

In a case where, with respect to such a P-type element (N-type element), rectangular first electrodes 20A and 20B that extend from the P-type layer 11 to the N-type layer 12 are formed using a Cu alloy and they are provided to have, for example, a rectangular shape in which a dimension z2 along the longitudinal direction of the P-type element (N-type element) is 1 mm and a dimension y2 along the lamination direction is 4 mm as shown in FIG. 3 with a thickness of 0.1 mm, the electric resistance of the first electrodes 20A and 20B is about 0.3 mΩ.

The method for forming the first electrodes 20A and 20B provided on the third striped surface 1C is not limited, and non-sintered first electrodes 20A and 20B can be provided on the third striped surface 1C of the first laminate 10 by printing, plating, sputtering, or vapor deposition.

(External Wiring Portion)

In the laminated thermoelectric conversion element 1, as shown in FIG. 1, an external wiring portion 31 is provided in the P-type layer 11 forming the non-striped surface 1E. Specifically, it is provided on the end surface 11A of the P-type layer 11 positioned opposite to the end surface 11B on the first electrode 20B side. In addition, an external wiring portion 32 is provided in the N-type layer 12 forming the non-striped surface 1F. Specifically, it is provided on the end surface 12A of the N-type layer 12 positioned opposite to the end surface 12B on the first electrode 20B side. In other words, the external wiring portions 31 and 32 are provided at positions away from the first electrodes 20A and 20B, respectively.

The external wiring portions 31 and 32 are not limited to electrodes fixed to P-type element and the N-type element, and spring members such as springs that are provided on an inner surface of a case housing the laminated thermoelectric conversion element 1 and elastically come into contact with the P-type element and the N-type element may be used as the electrodes.

The external wiring portions 31 and 32 may be provided on the third striped surface 1C.

(Manufacturing of Element)

Next, a method for manufacturing the laminated thermoelectric conversion element 1 will be described. The manufacturing method includes a joined body for division formation step of forming a joined body for division having a large area and having a lamination structure in which P-type plate materials formed of a e thermoelectric conversion material and N-type plate materials formed of an N-type thermoelectric conversion material are alternately provided in a lamination direction with an insulating material disposed therebetween, a first electrode formation step of forming an electrode-attached joined body for division by providing a plurality of electrodes each ranging from the P-type plate material to the N-type plate material on a side surface of the joined body for division where the layers are exposed, and a division step of dividing the electrode-attached joined body for division into a plurality of laminated thermoelectric conversion elements 1.

Hereinafter, the steps will be described individually.

(Joined Body for Division Formation Step)

In a case where the joined body for division formation step is performed, a plurality of P-type plate materials formed into a plate shape by sintering a P-type thermoelectric conversion material, a plurality of N-type plate materials formed into a plate shape by sintering an N-type thermoelectric conversion material, and a plurality of sheet-shaped insulating material members formed of an insulating material are prepared in advance. The P-type plate materials, the N-type plate materials, and the sheet-shaped insulating material members are formed to have the same rectangular shapes in a plan view. A member having pressure sensitive adhesiveness on both surfaces can be used as the sheet-shaped insulating material member.

Figure 6:
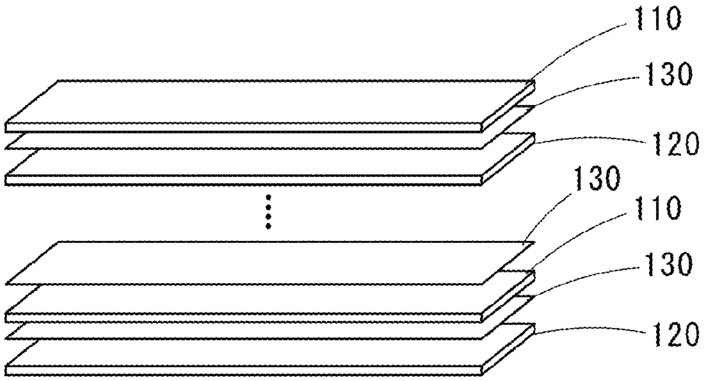
FIG. 6 is a diagram for describing a step for manufacturing the laminated thermoelectric conversion element according to the first embodiment of the present invention.
Figure 7:
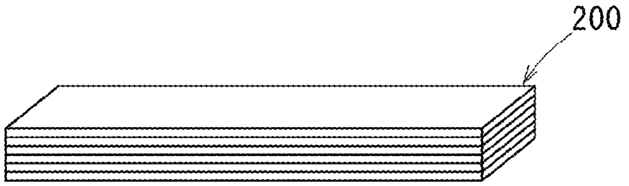
FIG. 7 is a diagram for describing a step for manufacturing the laminated thermoelectric conversion element according to the first embodiment of the present invention.

As shown in FIG. 6, P-type plate materials 110 and N-type plate materials 120 are alternately laminated while a sheet-shaped insulating material member 130 is disposed between the P-type plate material 110 and the N-type plate material 120. The plate materials are bonded with the sheet-shaped insulating material members 130 to manufacture a joined body 200 having a rectangular parallelepiped shape as shown in FIG. 7.

In a case where a plate material formed of ceramics, whose outer shape is the same as the P-type plate material 110 and the N-type plate material 120 in a plan view, is used as an insulating material, the P-type plate materials 110 and the N-type plate materials 120 are alternately disposed in the lamination direction while an insulating plate material is disposed therebetween, and they are sintered in a state of being overlapped with each other to manufacture the joined body for division 200.

(Electrode Formation Step)

Figure 8:
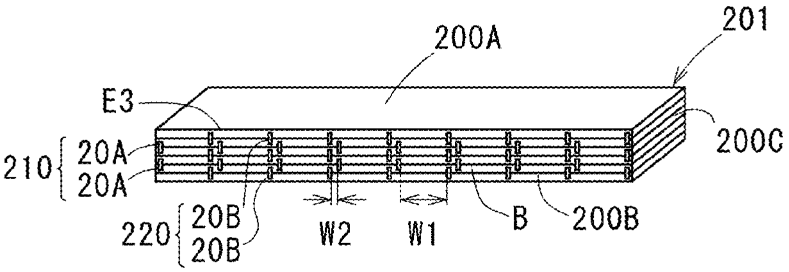
FIG. 8 is a diagram for describing a step for manufacturing the laminated thermoelectric conversion element according to the first embodiment of the present invention.

In the electrode formation step, as shown in FIG. 8, first electrodes 20A and 20B are provided on a wide side surface 200B along one long side edge E3 of an upper surface 200A of the joined body for division 200 and on the other wide side surface 200C positioned on the opposite side of the wide side surface 200B to form an electrode-attached joined body for division 201. In other words, the first electrodes 20A and 20B are provided on the side surfaces 200B and 200C where the P-type plate materials 110, the N-type plate materials 120, and the sheet-shaped insulating material members 130 are shown in a layered shape.

As the first electrodes 20A and 20B, an upper electrode row 210 in which a plurality of the upper first electrodes 20A are arranged in the lamination direction of the P-type plate material 110, the N-type plate material 120, and the sheet-shaped insulating material member 130, and a lower electrode row 220 provided at a position away from the position of the upper electrode row 210 in a boundary direction in which a boundary B between the respective layers of the electrode-attached joined body for division 201 extends, in which a plurality of the lower first electrodes 20B are arranged in the lamination direction of the P-type plate material 110, the N-type plate material 120, and the sheet-shaped insulating material member 130, are provided. The upper electrode 20A and the lower electrode 20B are formed to range from the P-type plate material to the N-type plate material.

In the electrode-attached joined body for division 201, a plurality of electrode sets in which the upper electrode row 210 and the lower electrode row 220 form one set are provided to be arranged in the boundary direction of the layers of the first laminate 10 on the side surfaces 200B and 200C. In one electrode set, the upper first electrode 20A and the lower first electrode 20B are provided so that one of the first electrodes 20A and 20B is offset in the lamination direction by one layer of the P-type plate material 110 (P-type layer 11) or the N-type plate material 120 (N-type layer 12), and thus upper end portions (lower end portions) are arranged laterally in the same layer.

In the electrode-attached joined body for division 201, an interval W1 between the first electrode 20A and the first electrode 20B in one electrode set is set wide, and an interval W2 between the respective electrode sets is set narrow (W2<W1).

(Division Step)

In the division step, the electrode-attached joined body for division 201 is divided into a plurality of laminated thermoelectric conversion elements 1.

Figure 9:
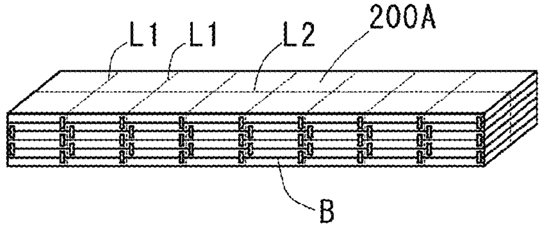
FIG. 9 is a diagram for describing a step for manufacturing the laminated thermoelectric conversion element according to the first embodiment of the present invention.

As shown in FIG. 9, the electrode-attached joined body for division 201 is divided along a plurality of cutting lines L1 extending in parallel with a short side edge and one cutting line L2 extending in parallel with the long side edge E3, which are shown by broken lines on the upper surface 200A. In the division step, the cutting lines L1 are set between the respective electrode sets and the wide side surface 200B is divided so that the plurality of electrode sets provided on the wide side surface 200B are divided into individual sets.

In the example shown in the drawing, sixteen laminated thermoelectric conversion elements 1 are manufactured from the electrode-attached joined body for division 201. In a case where the short side edge of the upper surface 200A is set short, the electrodes may be formed only on one wide side surface 200B, no electrodes may be provided on the opposite side surface 200C, the cutting line L2 may not be set, and the electrode-attached joined body for division 201 may be divided into a plurality of the laminated thermoelectric conversion elements 1 along a plurality of cutting lines L1 extending in parallel with the short side edge.

In the laminated thermoelectric conversion element 1 produced in the division step, the plurality of first electrodes (upper first electrode 20A, lower first electrode 20B) provided on the third striped surface 1C electrically connect the P-type layer 11 formed of the P-type plate material 110 and the N-type layer 12 formed of the N-type plate material 120 in series.

The laminated thermoelectric conversion element 1 formed through the division step can be disposed between a first plate-shaped portion 310 and a second plate-shaped portion 320 to constitute a thermoelectric conversion module, as will be described later.

(Another Example of Electrode Arrangement)

In the laminated thermoelectric conversion element 1 manufactured by the above-described manufacturing method, the upper first electrode 20A and the lower first electrode 20B are provided to be away from the edges E1 and E2 of the first striped surface 1A on the upper side and the second striped surface 1B on the lower side of the first laminate 10 as shown in FIG. 1. However, as in a laminated thermoelectric conversion element 2 shown in FIG. 10, the upper first electrode 20A and the lower first electrode 20B may be provided to be adjacent to the edges E1 and E2 of the first striped surface 1A on the upper side and the second striped surface 1B on the lower side of the first laminate 10 (to the end portions of the third striped surface 1C).

Figure 11:
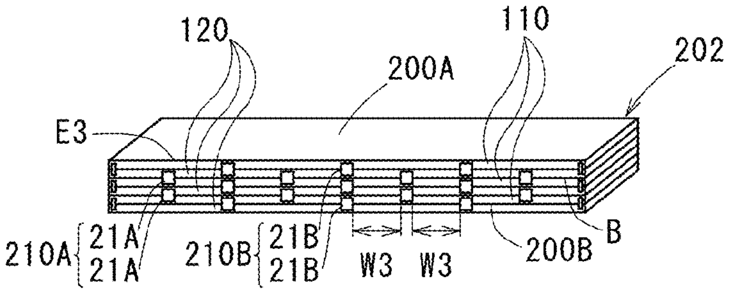
FIG. 11 is a diagram for describing a step for manufacturing the laminated thermoelectric conversion element of FIG. 10.

In this case, in the electrode manufacturing process, as shown in FIG. 11, an upper electrode row 210A in which upper electrode forming portions 21A, each corresponding to a size in which two upper first electrodes 20A are arranged, are arranged in the lamination direction, and a lower electrode row 210B provided at a position away from the position of the upper electrode row 210A in a boundary direction in which the boundary B extends, in which lower electrode forming portions 21B, each corresponding to a size in which two lower first electrodes 20B are arranged, are arranged in the lamination direction, are provided in an electrode-attached joined body for division 202. In the electrode-attached joined body for division 202, a plurality of the upper electrode rows 210A and a plurality of the lower electrode rows 210B are provided to be alternately arranged at equal intervals W3 in the boundary direction in which the boundary B between the respective layers extends.

The upper electrode forming portion 21A and the lower electrode forming portion 21B are provided over the P-type plate material 110 and N-type plate material 120 adjacent to each other. The upper electrode forming portion 21A and the lower electrode forming portion 21B are provided so that one of the upper electrode forming portion 21A and the lower electrode forming portion 21B is offset in the lamination direction by one layer of the P-type plate material 110 or the N-type plate material 120, and thus upper end portions (lower end portions) are arranged laterally in the same layer.

Figure 10:
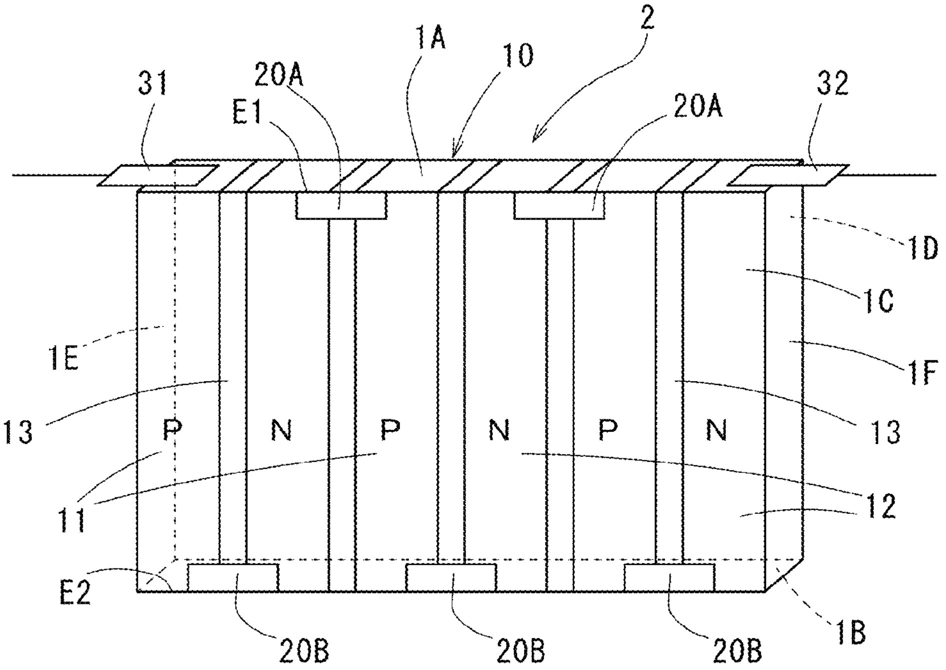
FIG. 10 is a perspective view showing a modification example of the laminated thermoelectric conversion element according to the first embodiment of the present invention.
Figure 12:
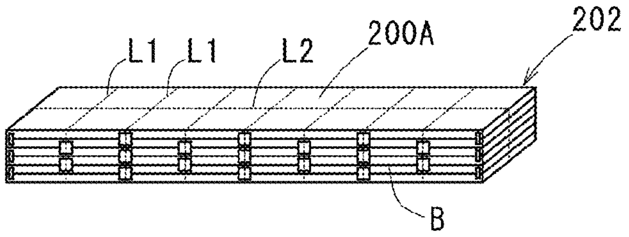
FIG. 12 is a diagram for describing a step for manufacturing the laminated thermoelectric conversion element of FIG. 10.

In the division step, the electrode-attached joined body for division 202 is divided into a plurality of laminated thermoelectric conversion elements 1 along cutting lines L1 and L2 shown by broken lines in FIG. 12. In the division, one upper electrode forming portion 21A is divided into two upper electrodes 20A, and one lower electrode forming portion 21B is divided into two lower electrodes 20B. Therefore, in the cut laminated thermoelectric conversion element 1, as shown in FIG. 10, the upper electrode 20A is provided adjacent to the edge E1 of the first striped surface 1A, and the lower electrode 20B is provided adjacent to the edge E2 of the second striped surface 1B.

In a case where the upper first electrode 20A and the lower first electrode 20B are provided adjacent to the first striped surface 1A and the second striped surface 1B, respectively, the distance between the upper first electrode 20A and the lower first electrode 20B along the longitudinal direction in each P-type layer 11 and each N-type layer 12 is longer than that in a case where the upper electrode 20A and the lower electrode 20B are provided to be away from the edges E1 and E2 of the first striped surface 1A and the second striped surface 1B, respectively, and a difference in temperature of the P-type layer 11 or the N-type layer 12 between the part where the upper first electrode 20A is joined and the part where the lower first electrode 20B is joined increases. Therefore, an electromotive force to be generated increases.

(Thermoelectric Conversion Module 300)

Next, a thermoelectric conversion module 300 using the laminated thermoelectric conversion element 1 will be described.

Figure 13:
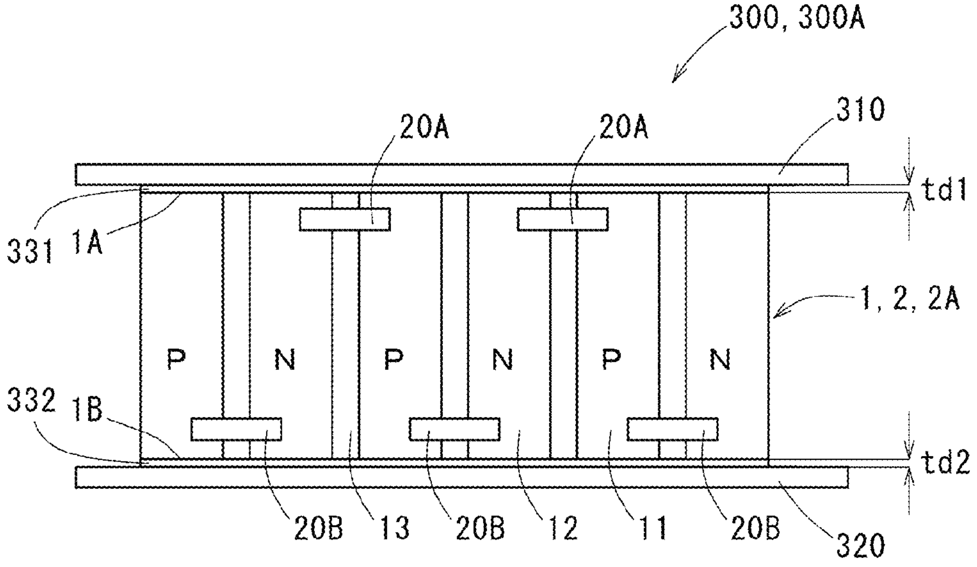
FIG. 13 is a front view showing a thermoelectric conversion module using the laminated thermoelectric conversion element of FIG. 1.

As shown in FIG. 13, the thermoelectric conversion module 300 includes a first plate-shaped portion 310 that is formed into a plate shape and provided for a high temperature side, a second plate-shaped portion 320 that is formed into a plate shape and provided for a low temperature side, a laminated thermoelectric conversion element 1 that is provided between the first plate-shaped portion 310 and the second plate-shaped portion 320, a second heat transfer layer 331 that is provided between the first plate-shaped portion 310 and the laminated thermoelectric conversion element 1 and has electrical insulating properties, and second heat transfer layers 332 that are provided between the second plate-shaped portion 320 and the laminated thermoelectric conversion element 1 and have electrical insulating properties.

In a case where the first plate-shaped portion 310 has high insulating properties, the second heat transfer layer 331 may not be provided. On the contrary, in a case where the first plate-shaped portion 310 is a metal, the second heat transfer layer 331 is necessarily provided.

It is desirable that the first plate-shaped portion 310 and the second plate-shaped portion 320 have small thermal resistance, and they are formed of any one of a resin, high-thermal-conductivity ceramics, or a metal. For example, a thermally conductive sheet can also be used.

The second heat transfer layers 331 and 332 are formed of a resin or ceramics having small thermal resistance and further having electrical insulating properties. Thicknesses td1 and td2 of the second heat transfer layers 331 and 332 are, for example, 10 μm to 10 mm.

By changing the thicknesses td1 and td2 of the second heat transfer layers 331 and 332, the temperature of the laminated thermoelectric conversion element 1 can be controlled. For example, in a case where the thickness td1 of the second heat transfer layer 331 joined to the first plate-shaped portion 310 for a high temperature side is made larger than the thickness td2 of the second heat transfer layer 332 joined to the second plate-shaped portion 320 for a low temperature side (td1>td2), the amount of heat flowing to the laminated thermoelectric conversion element 1 through the first plate-shaped portion 310 for a high temperature side and the second heat transfer layer 331 is limited, and the laminated thermoelectric conversion element 1 can be made to have a predetermined temperature or lower.

In the laminated thermoelectric conversion element 1, a first striped surface 1A is joined to an inner surface of the first plate-shaped portion 310 through the second heat transfer layer 331, and a lower second striped surface 1B is joined to an inner surface of the second plate-shaped portion 320 through the second heat transfer layer 332.

In a case where the first plate-shaped portion 310 and the second plate-shaped portion 320 are formed of a conductive material, it is necessary to provide the second heat transfer layers 331 and 332 between the first plate-shaped portion 310 (second plate-shaped portion 320) and the laminated thermoelectric conversion element. However, in a case where the first plate-shaped portion 310 and the second plate-shaped portion 320 are formed of an insulating material such as a resin or ceramics, the second heat transfer layers 331 and 332 may be omitted, the first striped surface 1A of the laminated thermoelectric conversion element 1 may be joined to the inner surface of the first plate-shaped portion 310, and the second striped surface 1B may be joined to the inner surface of the second plate-shaped portion 320.

For example, a thermoelectric conversion module 300 can be used in which a high-temperature heat source (not shown) is disposed outside the first plate-shaped portion 310 and a cooling device (not shown) is disposed outside the second plate-shaped portion 320. In this case, an electromotive force is generated according to a temperature difference between the first plate-shaped portion 310 and the second plate-shaped portion 320, and thus a potential difference of the sum of electromotive forces generated in the respective P-type elements and N-type elements is obtained between the external wiring portions 31 and 32 at both ends of the arrangement of the thermoelectric conversion materials (P-type elements and N-type elements).

The laminated thermoelectric conversion element 1 of the first embodiment is configured by laminating the P-type layers 11 and the N-type layers 12 with the first insulating layer 13 disposed therebetween, and the first electrodes (upper electrodes 20A and lower electrodes 20B) that electrically connect the P-type layers 11 and the N-type layers 12 are further provided on the side surface (third striped surface 1C) that is not contact with the first plate-shaped portion 310 and the second plate-shaped portion 320. Therefore, the first striped surface 1A for a high temperature side and the second striped surface 1B for a low temperature side, where the end surfaces of the layers are arranged, can be fully joined to the first plate-shaped portion 310 and the second plate-shaped portion 320, respectively.

In the thermoelectric conversion module 300 using the laminated thermoelectric conversion element 1, heat from a high-temperature heat source can be allowed to flow from the first plate-shaped portion 310 into each thermoelectric conversion material through the first striped surface 1A. In addition, the heat can be allowed to flow from each thermoelectric conversion material to the second plate-shaped portion 320 through the second striped surface 1B.

In an integrated thermoelectric conversion element (FIG. 1 of PTL 1) of the related art, electrodes provided on a part of upper and lower surfaces are joined to insulating substrates respectively provided on the high temperature side and the low temperature side, and thus a heat flow passing the through P-type and N-type thermoelectric conversion materials through the electrodes is small.

In the laminated thermoelectric conversion element 1 of the first embodiment, the entire first striped surface 1A for a high temperature side (second striped surface 1B for a low temperature side) is brought into contact with the inner surface of the first plate-shaped portion 310 (second plate-shaped portion 320). Therefore, the amount of a heat flow passing through each thermoelectric conversion material increases compared to the integrated thermoelectric conversion element (PTL 1) of the related art, and thus it is possible to improve the power generation performance (output voltage density) per unit area.

In the integrated thermoelectric conversion element (FIG. 2 of PTL 1) of the related art, between the P-type thermoelectric material and the N-type thermoelectric material, ceramics having a smaller area than the P-type and N-type thermoelectric materials are disposed, portions between which no ceramics are interposed are directly connected to each other, and the thicknesses of the P-type thermoelectric material and the N-type thermoelectric material in the lamination direction vary between the connecting portion and the insulating portion. In a case where the thicknesses vary as described above, there is a concern that the peeling may occur in the connecting portion due to thermal expansion or the like caused by a change in temperature of the integrated thermoelectric conversion element.

On the other hand, in the first laminate 10 of the laminated thermoelectric conversion element 1 of the first embodiment, the P-type layer 11 and the N-type layer 12 have the flat surfaces 11E, 11F, 12E, and 12F for joining to the first insulating layer 13, respectively, the flat surfaces 11E, 11F, 12E, and 12F are fully joined to the first insulating layer 13, and the P-type layer 11 and the N-type layer 12 are laminated with the first insulating layer 13 disposed therebetween. Therefore, it is possible to prevent the P-type layer 11 and the N-type layer 12 from being peeled off.

Furthermore, in the integrated thermoelectric conversion element (FIG. 2 of PTL 1) of the related art, the P-type and N-type thermoelectric materials are directly joined to each other and a depletion layer (a region that is electrically insulated with little carriers) is generated, so that the electric resistance is large and the output is significantly reduced in a range of about room temperature to 200° C. On the other hand, in the present invention, since the P-type layer 11 and the N-type layer 12, which are thermally and electrically insulated by the first insulating layer 13, are connected by the first electrodes 20A and 20B provided on the third striped surface 1C of the first laminate 10, the problems of the integrated thermoelectric conversion element (FIG. 2 of PTL 1) of the related art do not occur, and it is possible to favorably output electromotive forces generated in the P-type layer 11 and the N-type layer 12.

Second Embodiment

Figure 16:
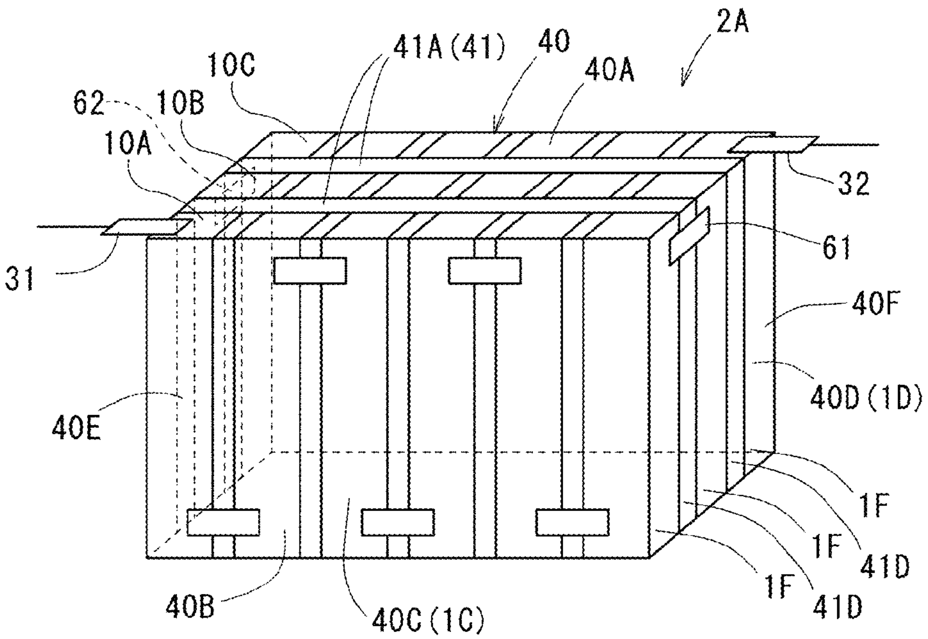
FIG. 16 is a perspective view showing the laminated thermoelectric conversion element according to the second embodiment of the present invention.

In the first embodiment, the laminated thermoelectric conversion element 1 is formed of one first laminate 10 and the plurality of first electrodes 20A and 20B provided on the third striped surface 1C of the first laminate 10, but a laminated thermoelectric conversion element 2A of a second embodiment includes a plurality of first laminates 10 provided with first electrodes 20A and 20B, and a second electrode 61 that electrically connects the first laminates 10 (see FIG. 16).

In the laminated thermoelectric conversion element 2A of the second embodiment, the plurality of first laminates 10 are disposed according to at least one of the following placement P1 or P2.

Figure 14:
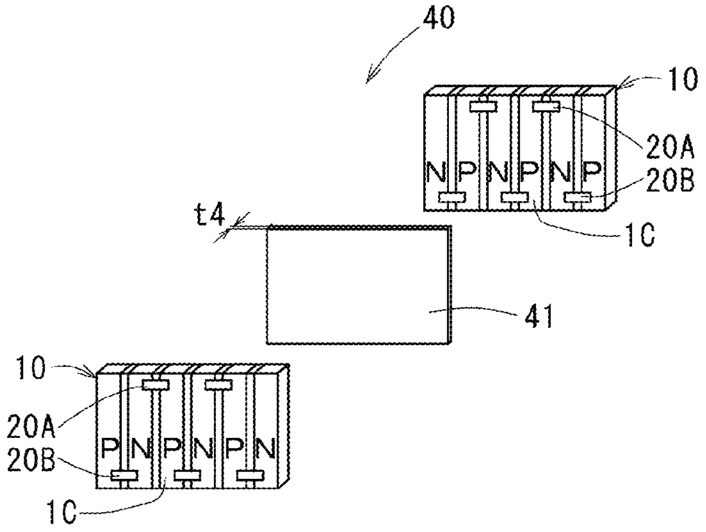
FIG. 14 is a diagram for describing a configuration of a laminated thermoelectric conversion element according to a second embodiment of the present invention.

Placement P1: As shown in FIG. 14, a plurality of first laminates 10 provided with first electrodes 20A and 20B are laminated in a direction perpendicular to a third striped surface 1C, and a second insulating layer 41 is disposed between the first laminates 10 to constitute a second laminate 40.

Figure 15:
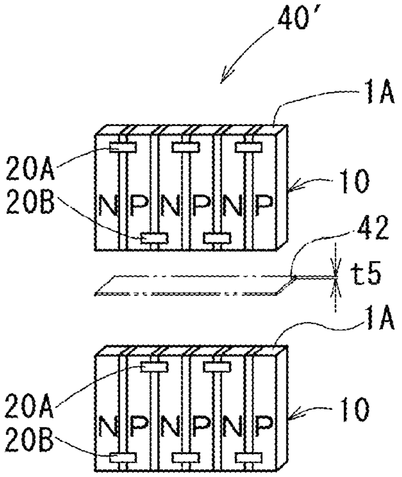
FIG. 15 is a diagram for describing a configuration of the laminated thermoelectric conversion element according to the second embodiment of the present invention.

Placement P2: As shown in FIG. 15, a plurality of first laminates 10 provided with first electrodes 20A and 20B are laminated in a direction perpendicular to a first striped surface 1A, and a first heat transfer layer 42 is disposed between the first laminates 10 to constitute e a third laminate 140.

Figure 18:
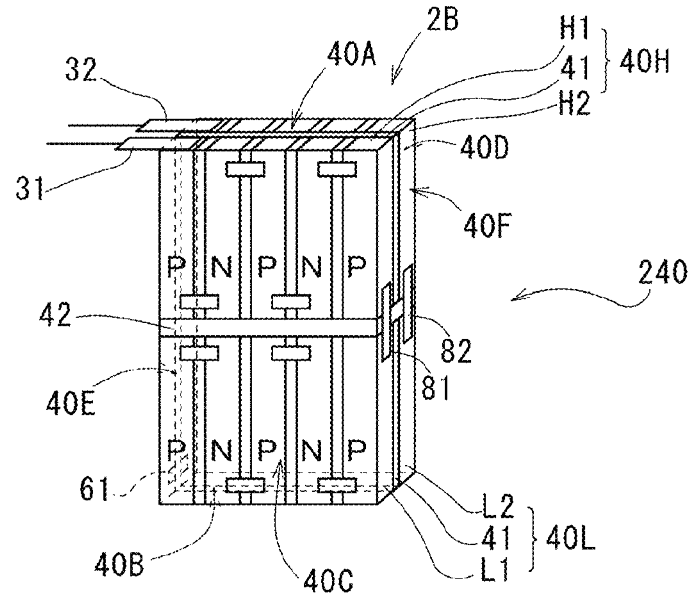
FIG. 18 is a perspective view showing a modification example of the laminated thermoelectric conversion element according to the second embodiment of the present invention.

In FIGS. 14 and 15, the first laminates 10 are shown separately for description, but the first laminates 10 are in close contact with each other through the second insulating layer 41 or the first heat transfer layer 42. In addition, as shown in FIG. 18, a composite body (fourth laminate serving as the second laminate 40 and also as the third laminate 140) may be configured by laminating a plurality of first laminates 10 according to both the placement P1 and the placement P2.

The second insulating layer 41 is formed of a resin, ceramics, glass, or the like having electrical insulating properties, and suppresses the transfer of heat and electricity between the first laminates 10 arranged side by side. A material having a low thermal conductivity is particularly preferable, and the same insulating material as the first insulating layer 13 of the first laminate 10 can be used. A thickness t4 of the second insulating layer 41 is about twice the thickness of the first electrode 20A or 20B, and can be set to, for example, 0.2 mm.

Similar to the second heat transfer layers 331 and 332, the first heat transfer layer 42 is formed of a resin or ceramics having small thermal resistance and further having electrical insulating properties. A thickness t5 of the first heat transfer layer 42 can be set to, for example, 50 μm.

Figure 17:
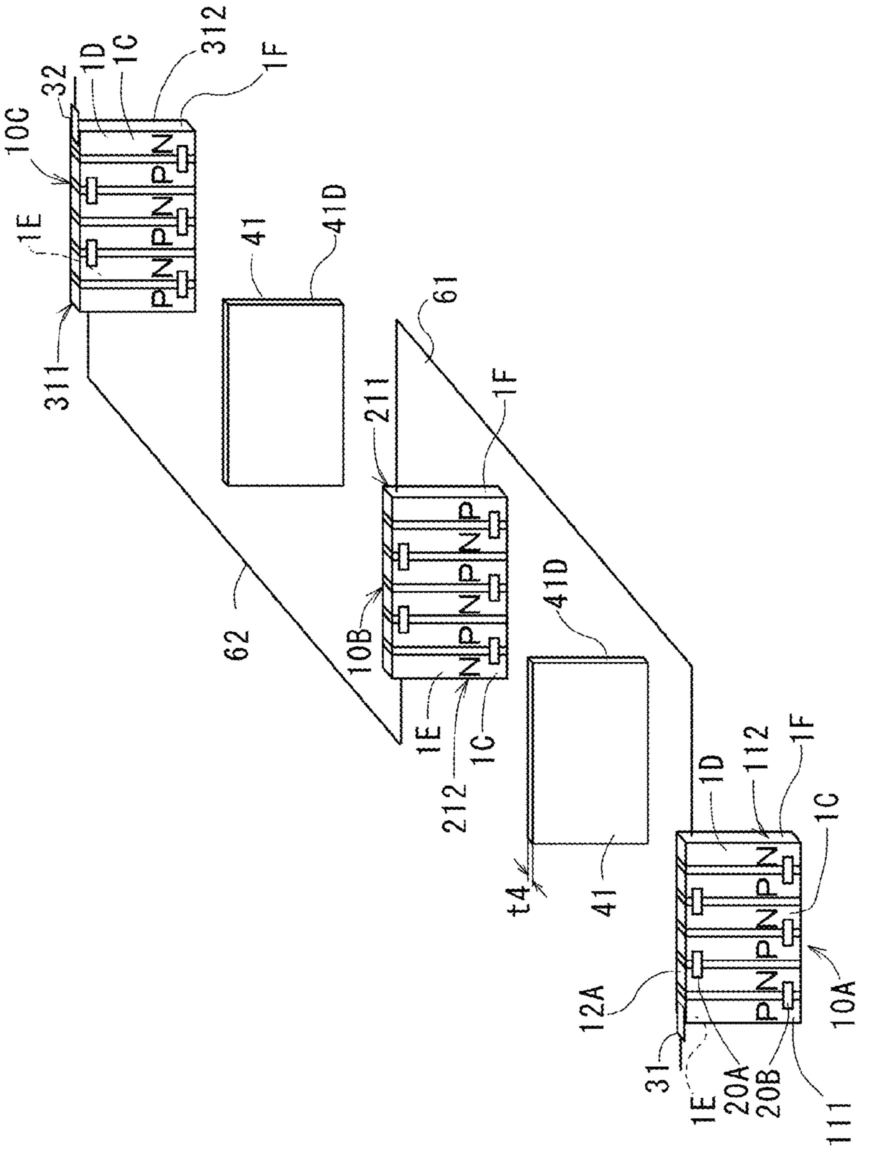
FIG. 17 is an exploded perspective view of a second laminate of the laminated thermoelectric conversion element of FIG. 16.

In the laminated thermoelectric conversion element 2A shown in FIG. 16, three first laminates 10A, 10B, and 10C provided with first electrodes 20A and 20B are laminated according to the placement P1 to constitute the second laminate 40. FIG. 17 is an exploded perspective view of the second laminate 40 of FIG. 16, in which the first laminates 10A, 10B, and 10C are arranged in order from the front in a depth direction.

The second insulating layer 41 is formed into a film shape, for example, and two second insulating layers 41 are provided in the example shown in the drawing. The second insulating layer 41 on the front side is interposed between a fourth striped surface 1D (a surface where the first electrodes 20A and 20B are not provided) of the first laminate 10A and a third striped surface 1C (a surface where the first electrodes 20A and 20B are provided) of the first laminate 10B, and the second insulating layer 41 on the rear side is interposed between a fourth striped surface 1D (a surface where the first electrodes 20A and 20B are not provided) of the first laminate 10B and a third striped surface 1C (a surface where the first electrodes 20A and 20B are provided) of the first laminate 10C.

As shown in FIG. 16, the second laminate 40 has a rectangular parallelepiped shape, and has an end surface 40A for a high temperature side, an end surface 40B for a low temperature side provided on the opposite side of the end surface 40A, and side surfaces that extend from edges of the end surface 40A to the end surface 40B.

The end surface 40A for a high temperature side is formed so that first striped surfaces 1A of the plurality of first laminates 10A, 10B, and 10C are connected in a flush manner with an end surface 41A of the second insulating layer 41 disposed therebetween. The end surface 40B for a low temperature side is formed so that second striped surfaces 1B of the plurality of first laminates 10A, 10B, and 10C are connected in a flush manner with an end surface of the second insulating layer 41 disposed therebetween.

The side surfaces of the second laminate 40 include a first side surface 40C formed of the third striped surface 1C of the first laminate 10A, a second side surface 40D formed of the fourth striped surface 1D of the first laminate 10C, a third side surface 40E that extends from an edge of the first side surface 40C to an edge of the second side surface 40D, where non-striped surfaces 1E of the first laminates 10A, 10B, and 10C are connected in a flush manner with an end surface of the second insulating layer 41 disposed therebetween, and a fourth side surface 40F that extends from an edge of the first side surface 40C to an edge of the second side surface 40D and is formed on the opposite side of the third side surface 40E, where non-striped surfaces 1F of the first laminates 10A, 10B, and 10C are connected in a flush manner with an end surface 41D of the second insulating layer 41 disposed therebetween.

On the fourth side surface 40F, a second electrode 61 that connects the first laminate 10A and the first laminate 10B is provided. On the third side surface 40E, a second electrode 62 that connects the first laminate 10B and the first laminate 10C is provided. Similar to the first electrodes 20A and 20B of the first laminates 10A, 10B, and 10C, the second electrodes 61 and 62 are formed of Cu, Ag, Al, Ni, Au, Pt, Pd, Ti, V, Bi, Fe, Cr, Ta, W, Mo, In, or Zn, or an alloy containing one or more of the elements, and Cu with a low electric resistivity is preferably used. It is desirable that the second electrodes 61 and 62 correspond to 10% or less of the electric resistance of one P-type element or one N-type element constituting the first laminate 10.

As shown in FIG. 17, in the two first laminates 10A and 10B adjacent to each other through the second insulating layer 41, the arrangement of P-type layers 11 and N-type layers 12 of the first laminate 10A in the lamination direction (arranged in the order of P, N, P, N, P, N) and the arrangement of P-type layers 11 and N-type layers 12 of the first laminate 10B in the lamination direction (arranged in the order of N, P, N, P, N, P) are different. Similarly, the first laminates 10B and 10C have different arrangements of P-type layers 11 and N-type layers 12 in the lamination direction.

In the third side surface 40E, as the non-striped surfaces 1E of the first laminates 10A, 10B, and 10C, the P-type layers 11 and the N-type layers 12 are alternately arranged in a direction perpendicular to the third striped surface 1C. In the fourth side surface 40F, as the non-striped surfaces 1F of the first laminates 10A, 10B, and 10C, the P-type layers 11 and the N-type layers 12 are alternately arranged in a direction perpendicular to the third striped surface 1C. In the laminated thermoelectric conversion element 2A, the second electrode 61 is provided on the fourth side surface 40F of the second laminate 40, and the second electrode 62 is provided on the third side surface 40E of the second laminate 40.

The second electrode 61 connects the N-type element (N-type layer 12) of the first laminate 10A and the P-type element (P-type layer 11) of the first laminate 10B. In the N-type element (N-type layer 112 shown in FIG. 17) of the first laminate 10A forming the fourth side surface 40F, the second electrode 61 is provided close to the end surface 12A opposite to the end surface 12B on the first electrode 20B side, on the non-striped surface 1F of the first laminate 10A. In addition, in the P-type element (P-type layer 211 shown in FIG. 17) of the first laminate 10B forming the fourth side surface 40F, the second electrode 61 is provided close to the end surface 11A opposite to the end surface 11B on the first electrode 20B side, on the non-striped surface 1F of the first laminate 10B.

As schematically shown by a solid line in FIG. 17, the second electrode 62 connects the N-type element (N-type layer 12) of the first laminate 10B and the P-type element (P-type layer 11) of the first laminate 10C. In the N-type element (N-type layer 212 shown in FIG. 17) of the first laminate 10B forming the third side surface 40E, the second electrode 62 is provided close to the end surface 12A opposite to the end surface 12B on the first electrode 20B side, on the non-striped surface 1E of the first laminate 10B. In addition, in the P-type element (P-type layer 311 shown in FIG. 17) of the first laminate 10C forming the third side surface 40E, the second electrode 62 is provided close to the end surface 11A opposite to the end surface 11B on the first electrode 20B side, on the non-striped surface 1E of the first laminate 10C.

In this way, the second electrodes 61 and 62 are provided using the side surfaces of the second laminate 40, specifically, the non-striped surfaces 1E and 1F of the first laminates 10A, 10B, and 10C, and thus the P-type element (P-type layer 11) and the N-type element (N-type layer 12) constituting each of the first laminates 10A, 10B, and 10C are electrically connected in series.

(External Wiring Portion)

Furthermore, as shown in FIG. 17, in the laminated thermoelectric conversion element 2A, a plate-shaped external wiring portion 32 is provided on the non-striped surface 1F of the first laminate 10C to which the second electrode 61 is not connected, among the laminated first laminates 10A, 10B, and 10C, and a plate-shaped external wiring portion 31 is provided on the non-striped surface 1E of the first laminate 10A to which the second electrode 62 is not connected.

In the first laminate 10A, the external wiring portion 31 is joined to the end surface 11A opposite to the end surface 11B on the electrode 20B side in the P-type element (P-type layer 111 shown in FIG. 17) having the non-striped surface 1E to which the second electrode 61 is not connected. In the first laminate 10C, the external wiring portion 32 is joined to the end surface 12A opposite to the end surface 12B on the electrode 20B side in the N-type element (N-type layer 312 shown in FIG. 17) having the non-striped surface 1F to which the second electrode 62 is not connected.

The external wiring portions 31 and 32 may be provided on the third striped surface 1C of the first laminate 10A and the fourth striped surface 1D of the first laminate 10C, respectively.

In a thermoelectric conversion module 300A using the laminated thermoelectric conversion element 2A produced as described above, as shown in FIG. 13, the laminated thermoelectric conversion element 2A is disposed between a first plate-shaped portion 310 and a second plate-shaped portion 320. In a case where the first plate-shaped portion 310 and the second plate-shaped portion 320 are formed of a conductive material, the end surface 40A of the laminated thermoelectric conversion element 2A is covered with a second heat transfer layer 331 and the end surface 40B is covered with a second heat transfer layer 332. Then, the end surface 40A is joined to an inner surface of the first plate-shaped portion 310 through the second heat transfer layer 331, and the end surface 40B is joined to an inner surface of the second plate-shaped portion 320 through the second heat transfer layer 332.

In a case where the thermoelectric conversion module 300A configured as described above is used, for example, the first plate-shaped portion 310 is brought into contact with a high-temperature heat source (not shown), and the second plate-shaped portion 320 is brought into contact with a cooling device (not shown) to generate an electromotive force according to a temperature difference between the first plate-shaped portion 310 and the second plate-shaped portion 320. Thus, a potential difference of the sum of electromotive forces generated in the respective P-type elements and N-type elements is obtained between the external wiring portions 31 and 32 at both ends of the arrangement of the elements.

According to the laminated thermoelectric conversion element 2A of the second embodiment, the P-type element (P-type layer 11) and the N-type element (N-type layer 12) are laminated through the first insulating layer 13 or the second insulating layer 41 without a gap, and the first electrodes 20A and 20B and the second electrodes 61 and 62 connecting the P-type element and the N-type element are provided on the side surfaces of the first laminate 10 and the second laminate 40, so that the entire end surface 40A for a high temperature side (end surface 40B for a low temperature side) can be brought into contact with the inner surface of the first plate-shaped portion 310 (second plate-shaped portion 320).

Meanwhile, in the thermoelectric conversion module of the related art shown in PTL 1, the integrated thermoelectric conversion element is joined to the high temperature-side substrate (low temperature-side substrate) through the electrodes arranged side by side with a gap provided therebetween, and thus the efficiency of thermoelectric conversion relative to the area of the high temperature-side substrate (low temperature-side substrate) is low.

In the present embodiment, the entire end surface 40A for a high temperature side (end surface 40B for a low temperature side) is brought into contact with the first plate-shaped portion 310 (second plate-shaped portion 320). Therefore, the amount of a heat flow passing through each thermoelectric conversion material increases compared to the integrated thermoelectric conversion element (PTL 1) of the related art, and thus it is possible to improve the power generation performance per unit area.

(Another Example of Arrangement of Plurality of First Laminates)

In a laminated thermoelectric conversion element 2B shown in FIG. 18, four first laminates L1, L2, H1, and H2 having the same configuration as the first laminate 10 are disposed according to the placement P1 and the placement P2 to constitute a composite body 240 having a rectangular parallelepiped shape. Among the four first laminates L1, L2, H1, and H2, the two first laminates L1 and L2 constitute a lower portion 40L of the composite body 240, and the remaining two first laminates H1 and H2 constitute an upper portion 40H of the composite body 240.

Figure 19:
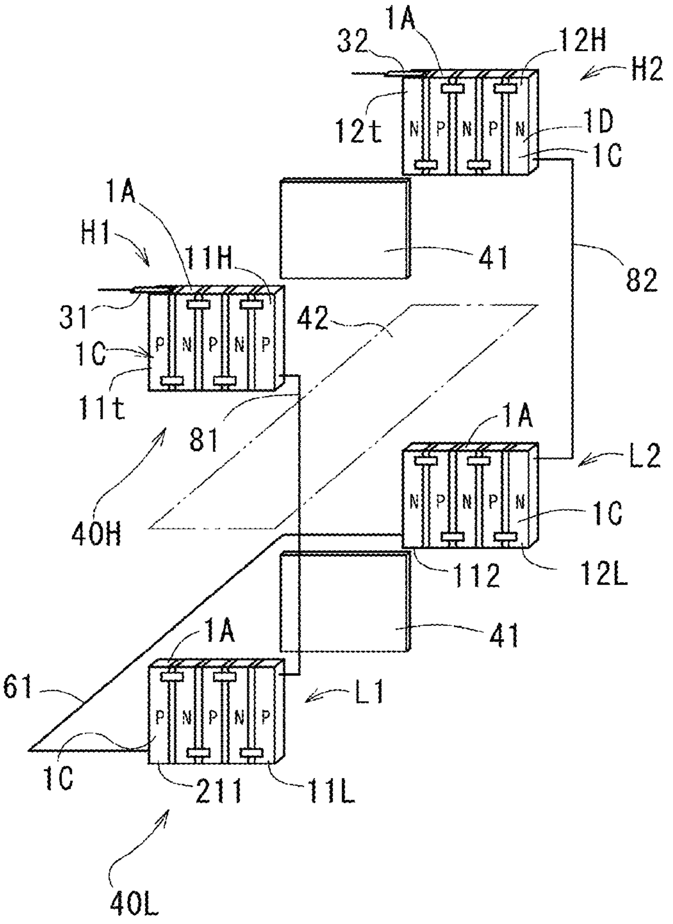
FIG. 19 is an exploded perspective view of a composite body of the laminated thermoelectric conversion element of FIG. 18.

As shown in FIG. 19, in the lower portion 40L, the two first laminates L1 and L2 are laminated with a second insulating layer 41 disposed therebetween in a direction perpendicular to a third striped surface 1C. In the upper portion 40H, the two first laminates H1 and H2 are also laminated with a second insulating layer 41 disposed therebetween in a direction perpendicular to a third striped surface 1C.

A first heat transfer layer 42 is disposed between the lower portion 40L and the upper portion 40H, and thus the first laminate L1 of the lower portion 40L and the first laminate H1 of the upper portion 40H, and the first laminate L2 of the lower portion 40L and the first laminate H2 of the upper portion 40H are laminated with the first heat transfer layer 42 disposed therebetween in a direction perpendicular to a first striped surface 1A (end surface 40A), respectively.

In the composite body 240, P-type layers 11 are formed of the same P-type thermoelectric conversion material and N-type layers 12 are formed of the same N-type thermoelectric conversion material in the lower portion 40L and the upper portion 40H, but the present invention is not limited to this case. In the lower portion 40L and the upper portion 40H, the P-type layers 11 or the N-type layers 12 may be formed of different thermoelectric conversion materials.

As shown in FIG. 18, the composite body 240 has an end surface 40A for a high temperature side, an end surface 40B for a low temperature side provided on the opposite side of the end surface 40A, and side surfaces that extend from edges of the end surface 40A to the end surface 40B. The end surface 40A is formed so that first striped surfaces 1A of the first laminates H1 and H2 of the upper portion 40H and an end surface of the second insulating layer 41 disposed between the first laminates H1 and H2 are connected in a flush manner. The end surface 40B is formed so that second striped surfaces 1B of the first laminates L1 and L2 of the lower portion 40L and an end surface of the second insulating layer 41 disposed between the first laminates L1 and L2 are connected in a flush manner.

The side surfaces of the composite body 240 include a first side surface 40C where third striped surfaces 1C of the first laminates L1 and H1 and an end surface of the first heat transfer layer 42 disposed between the first laminates L1 and H1 are connected in a flush manner, a second side surface 40D that is formed on the opposite side of the first side surface 40C, where fourth striped surfaces 1D of the first laminates L2 and H2 and an end surface of the first heat transfer layer 42 disposed between the first laminates L2 and H2 are connected in a flush manner, a third side surface 40E that is formed so that non-striped surfaces 1E of the first laminates L1, L2, H1, and H2, end surfaces of the second insulating layers 41 disposed between the first laminates L1 and H1 and L2 and H2, and an end surface of the first heat transfer layer 42 are connected in a flush manner, and extends from an edge of the first side surface 40C to an edge of the second side surface 40D, and a fourth side surface 40F that is formed so that non-striped surfaces 1F of the first laminates L1, L2, H1, and H2, end surfaces of the second insulating layers 41 disposed between the first laminates L1, L2, H1, and H2, and an end surface of the first heat transfer layer 42 are connected in a flush manner, and extends from an edge of the first side surface 40C to an edge of the second side surface 40D on the opposite side of the third side surface 40E.

In the laminated thermoelectric conversion element 2B, the four first laminates L1, L2, H1, and H2 constituting the composite body 240 are connected by electrodes 61, 81 and 82 provided on the third side surface 40E and the fourth side surface 40F. That is, the first laminates L1, L2, H1, and H2 are connected in series by the third electrode 81 that is provided on the fourth side surface 40F to connect the first laminates H1 and L1, the second electrode 61 that is provided on the third side surface 40E to connect the first laminates L1 and L2, and the third electrode 82 that is provided on the fourth side surface 40F to connect the first laminates L2 and H2.

In the composite body 240 in the example shown in the drawing, the second electrode 61 connecting the two first laminates L1 and L2 is provided on the third side surface 40E, and the two third electrodes 81 and 82 are provided on the fourth side surface 40F. One third electrode 81 connects the first laminate L1 and the first laminate H1, and the other third electrode 82 connects the first laminate L2 and the first laminate H2.

Similar to the second electrode 61, the third electrodes 81 and 82 are formed of Cu, Ag, Al, Ni, Au, Pt, Pd, Ti, V, Bi, Fe, Cr, Ta, W, Mo, In, or Zn, or an alloy containing one or more of the elements, and Cu with a low electric resistivity is preferably used. It is desirable that the third electrodes 81 and 82 correspond to 10% or less of the electric resistance of one P-type element or one N-type element constituting the first laminates L1, L2, H1, and H2.

As shown in FIG. 19, in the two first laminates L1 and L2 adjacent to each other through the second insulating layer 41 in the lower portion 40L, the arrangement of P-type layers 11 and N-type layers 12 of the first laminate L1 in the lamination direction (arranged in the order of P, N, P, N, P) and the arrangement of P-type layers 11 and N-type layers 12 of the first laminate L2 in the lamination direction (arranged in the order of N, P, N, P, N) are different. Similarly, in the upper portion 40H, the first laminates H1 and H2 have different arrangements of P-type layers 11 and N-type layers 12 in the lamination direction.

In the third side surface 40E, the P-type layer 211 of the first laminate L1 and the N-type layer 112 of the first laminate L2 are adjacent to each other through the second insulating layer 41, and are connected by the second electrode 61 as schematically shown by a solid line in FIG. 19.

In the P-type layer 211 of the first laminate L1 forming the third side surface 40E, the second electrode 61 is provided close to the end surface 11B opposite to the end surface 11A on the first electrode 20A side, on the non-striped surface 1E of the first laminate L1. In addition, in the N-type layer 112 of the first laminate L2 forming the third side surface 40E, the second electrode 61 is provided close to the end surface 12B opposite to the end surface 12A on the first electrode 20A side, on the non-striped surface 1E of the first laminate L2.

Furthermore, as shown in FIG. 19, the two first laminates L1 and H1 adjacent to each other through the first heat transfer layer 42 have the same arrangement of the P-type layers 11 and the N-type layers 12 in the lamination direction, and the P-type layers 11 and the N-type layers 12 are arranged in the order of P, N, P, N, P. The two first laminates L2 and H2 adjacent to each other through the first heat transfer layer 42 also have the same arrangement of the P-type layers 11 and the N-type layers 12 in the lamination direction, and the P-type layers 11 and the N-type layers 12 are arranged in the order of N, P, N, P, N.

As shown in FIG. 18, the third electrode 81 is provided on the fourth side surface 40F to electrically connect a P-type layer 11L of the first laminate L1 and a P-type layer 11H of the first laminate H1.

The third electrode 81 is formed over the non-striped surface 1F of the first laminate L1 and the non-striped surface 1F of the first laminate H1. Specifically, the third electrode 81 connects a portion of the first laminate L1 close to the first heat transfer layer 42 and a portion of the first laminate H1 close to the first heat transfer layer 42.

The first electrode 20B of the P-type layer 11L of the first laminate L1 and the first electrode 20A of the P-type layer 11H of the first laminate H1, which are connected by the third electrode 81, are provided to be away from the third electrode 81. That is, the first electrode 20B attached to the P-type layer 11L in the first laminate L1 is brought close to the end surface 11B, and the first electrode 20A attached to the P-type layer 11H in the first laminate H1 is brought close to the end surface 11A.

Furthermore, the third electrode 82 is provided on the fourth side surface 40F to electrically connect an N-type layer 12L of the first laminate L2 and an N-type layer 12H of the first laminate H2.

The third electrode 82 is formed over the non-striped surface 1F of the first laminate L2 and the non-striped surface 1F of the first laminate H2. Specifically, the third electrode 82 connects a portion of the first laminate L2 close to the first heat transfer layer 42 and a portion of the first laminate H2 close to the first heat transfer layer 42 through the first heat transfer layer 42.

The first electrode 20B of the N-type layer 12L of the first laminate L2 and the first electrode 20A of the N-type layer 12H of the first laminate H2, which are connected by the third electrode 82, are provided to be away from the third electrode 82. That is, the first electrode 20B attached to the N-type layer 12L in the first laminate L2 is brought close to the end surface 12B, and the first electrode 20A attached to the N-type layer 12H in the first laminate H2 is brought close to the end surface 12A.

In this way, the second electrode 61 and the third electrodes 81 and 82 are provided using the side surfaces 40D and 40E of the composite body 240, specifically, the non-striped surfaces 1E and 1F of the first laminates L1, L2, H1, and H2, and thus the P-type element and the N-type element constituting each of the first laminates L1, L2, H1, and H2 are electrically connected in series.

(External Wiring Portion)

As shown in FIG. 19, plate-shaped external wiring portions 31 and 32 are provided on the first laminates H1 and H2 each having the non-striped surface 1E where the second electrode 61 is not provided, among the laminated first laminates L1, L2, H1, and H2.

Regarding the first laminate H1, the external wiring portion 31 is joined to an end surface 11A opposite to the end surface 11B on the electrode 20B side, of a P-type layer 11*t* having a non-striped e 1E where the second electrode 61 and the third electrodes 81 and 82 are not provided. Regarding the first laminate H2, the external wiring portion 32 is joined to an end surface 12A opposite to the end surface 12B on the electrode 20B side, of an N-type layer 12*t* having a non-striped surface 1E where the second electrode 61 and the third electrodes 81 and 82 are not connected.

The external wiring portions 31 and 32 may be provided on the third striped surface 1C of the first laminate H1 and the fourth striped surface 1D of the first laminate H2, respectively. In other words, the external wiring portion 31 may be provided on the first side surface 40C of the composite body 240, and the external wiring portion 32 may be provided on the second side surface 40D, each positioned close to the end surface 40A.

Figure 20:
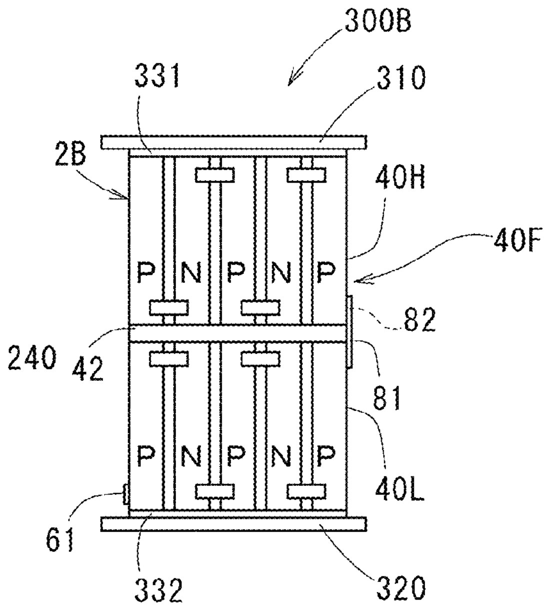
FIG. 20 is a front view showing a thermoelectric conversion module using the laminated thermoelectric conversion element of FIG. 18.

In a thermoelectric conversion module 300B using the laminated thermoelectric conversion element 2B produced as described above, as shown in FIG. 20, the laminated thermoelectric conversion element 2B is disposed between a first plate-shaped portion 310 and a second plate-shaped portion 320. In a case where the first plate-shaped portion 310 and the second plate-shaped portion 320 are formed of a conductive material, the end surface 40A of the laminated thermoelectric conversion element 2B is covered with a second heat transfer layer 331 having electrical insulating properties and the end surface 40B is also covered with a second heat transfer layer 332 having electrical insulating properties. Then, the end surface 40A is joined to an inner surface of the first plate-shaped portion 310 through the second heat transfer layer 331, and the end surface 40B is joined to an inner surface of the second plate-shaped portion 320 through the second heat transfer layer 332.

For example, in a case where the first plate-shaped portion 310 is brought into contact with a high-temperature heat source (not shown) and the second plate-shaped portion 320 is brought into contact with a cooling device (not shown), heat flows from the heat source toward the cooling device in the composite body 240. That is, the heat flows from the end surface 40A into the upper portion 40H through the first plate-shaped portion 310 and the second heat transfer layer 331, flows into the lower portion 40L through the P-type elements and the N-type elements of the upper portion 40H and the first heat transfer layer 42, flows toward the end surface 40B through the P-type elements and the N-type elements of the lower portion 40L, and moves to the second heat transfer layer 332 and the second plate-shaped portion 320. Therefore, an electromotive force is generated according to a temperature difference between the first plate-shaped portion 310 and the second plate-shaped portion 320, and a potential difference of the sum of electromotive forces generated in the respective P-type elements and N-type elements is obtained between the external wiring portions 31 and 32 at both ends of the arrangement of the elements.

In the laminated thermoelectric conversion element 2B that is a modification example of the second embodiment shown in FIGS. 17 to 20, the entire end surface 40A for a high temperature side (end surface 40B for a low temperature side) is brought into contact with the first plate-shaped portion 310 (second plate-shaped portion 320) as in the laminated thermoelectric conversion element 2 (modification example of the first embodiment). Therefore, the amount of a heat flow passing through each thermoelectric conversion material increases compared to the integrated thermoelectric conversion element (PTL 1) of the related art, and thus it is possible to improve the power generation performance per unit area.

Although the present invention has been described as above, the present invention can be implemented without being limited to the above description and the examples shown in the drawings. For example, it is needless to say that the dimensions and the number of the P-type layers or the N-type layers provided in the laminated thermoelectric conversion element, and the dimensions of the joined body can be implemented by changing the ratio of dimensions and the number of elements to be provided. In any of the second laminate, the third laminate, or the composite body, the number of the first laminates laminated is not limited to the example shown in the drawing. The used method is not limited to the above-described embodiments, and a laminated thermoelectric conversion element exhibiting electronic cooling/heat generation through the Peltier effect can also be used.

Figure 21:
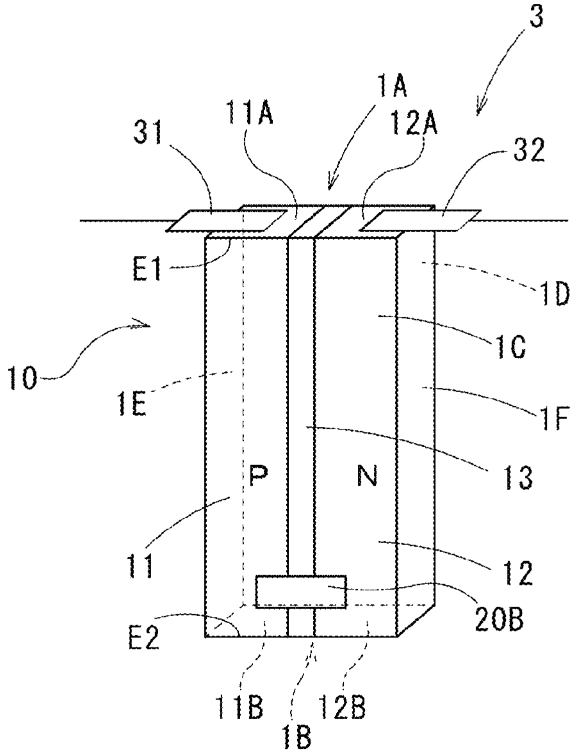
FIG. 21 is a perspective view showing a laminated thermoelectric conversion element according to another embodiment of the present invention.

FIG. 21 is a perspective view showing a laminated thermoelectric conversion element 3 according to another embodiment of the present invention. The laminated thermoelectric conversion element 3 is provided with one P-type layer 11 and one N-type layer 12 with a first insulating layer 13 disposed therebetween. An external wiring portion 31 is provided on an end surface 11A of the P-type layer 11, and an external wiring portion 32 is provided on an end surface 12A of the N-type layer. A first electrode 20B is provided close to an edge E2 of a second striped surface 1B opposite to the external wiring portions 31 and 32, on a third striped surface 1C. Instead of the lower first electrode 20B, an upper first electrode 20A may be provided close to an edge E1 of a first striped surface 1A, and the external wiring portions 31 and 32 may be disposed on the second striped surface 1B side (end surfaces 11B and 12B). The external wiring portions 31 and 32 may be provided on the third striped surface 1C.

(Manufacturing Method)

The manufacturing of the thermoelectric conversion module is not limited to the method in which the electrode-attached joined body for division 201 is divided to manufacture the laminated thermoelectric conversion element 1, and the thermoelectric conversion module may be individually produced as a single body without division. In this case, since the laminated thermoelectric conversion element 1 is produced without using the electrode-attached joined body for division 201, the following "laminate formation step" and "first electrode formation step" are included instead of the "joined body for division formation step" of producing the joined body for division 200, the "first electrode formation step" of producing the electrode-attached joined body for division 201, and the "division step" of dividing the electrode-attached joined body for division 201 to produce a plurality of first laminates provided with first electrodes.

In the "laminate formation step", a P-type plate material formed of a P-type thermoelectric conversion material, an N-type plate material formed of an N-type thermoelectric conversion material, and a first insulating layer disposed between the plate materials are laminated to form a first laminate. In the "first electrode formation step", a first electrode is formed on a third striped surface of the first laminate. A laminated thermoelectric conversion element 1 produced as above is disposed between a first plate-shaped portion 310 and a second plate-shaped portion 320, and thus a thermoelectric conversion module can be manufactured.

(Placement of First Electrode)

In the first embodiment and the like, the first electrodes (upper first electrode 20A and lower first electrode 20B) are disposed on one surface (third striped surface 1C) of the first laminate. However, in a case where the first laminate is configured by a plurality of times of lamination in which the first insulating layer 13 is disposed between the P-type layer 11 and the N-type layer 12, the plurality of first electrodes 20A and 20B connecting the P-type layer 11 and the N-type layer 12 of the first laminate 10 can be distributed and disposed on striped surfaces (third striped surface, fourth striped surface) other than the first striped surface 1A for a high temperature side and the second striped surface 1B for a low temperature side.

Figure 22:
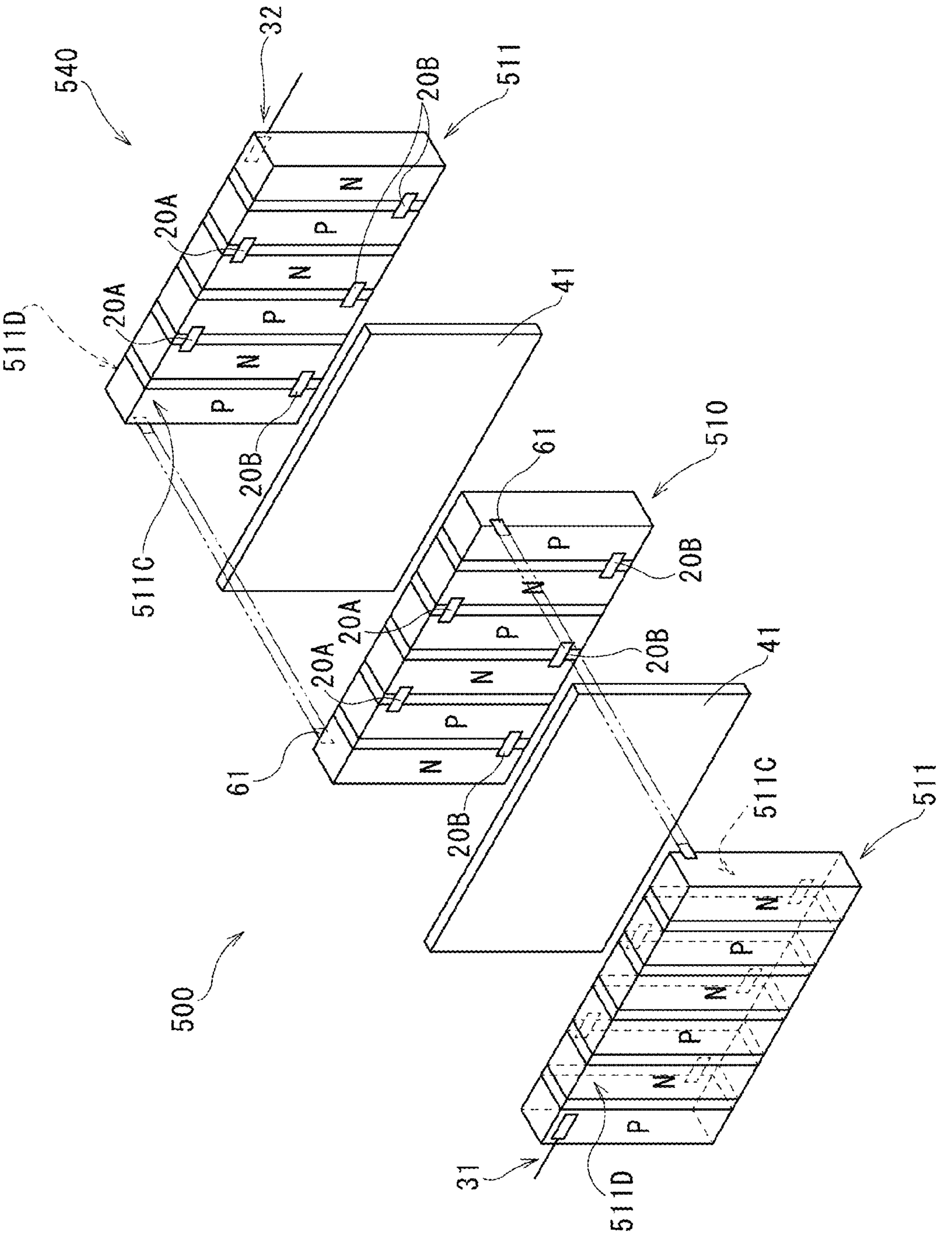
FIG. 22 is an exploded perspective view showing a laminated thermoelectric conversion element according to a third embodiment of the present invention.
Figure 23:
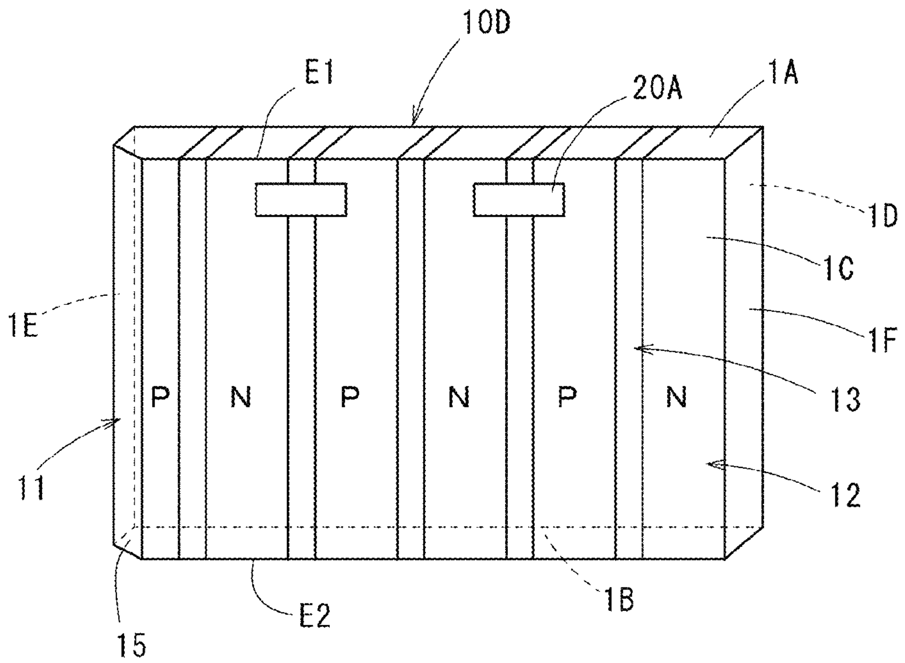
FIG. 23 is a perspective view showing a modification example of the first laminate of the laminated thermoelectric conversion element of FIG. 1.

For example, a first laminate 10D of FIGS. 22 and 23 has a plurality of striped surfaces (first striped surface 1A for a high temperature side, second striped surface 1B for a low temperature side, third striped surface 1C, fourth striped surface 1D), a plurality of first electrodes 20A are formed on an upper portion of the third striped surface 1C, and a plurality of first electrodes 20B are formed on a lower portion of the fourth striped surface 1D. Compared to a case where a plurality of first electrodes 20A and 20B are disposed on one surface (third striped surface 1C), the lower first electrodes 20B are disposed on the opposite surface to the upper first electrodes 20A, and thus a linear distance from the first electrode 20A to the first electrode 20B is increased, and an electromotive force to be generated increases.

As a preferable example of the placement of the first electrodes, a laminated thermoelectric conversion element 500 according to a third embodiment is shown in FIG. 22. The laminated thermoelectric conversion element 500 includes a second laminate 540 in which first laminates 510 and 511 and second insulating plates 41 are alternately laminated, and external wiring portions 31 and 32 attached to the second laminate 540. Here, the same elements as those in each of the above-described embodiments are denoted by the same reference signs, and description thereof will be omitted.

In the second laminate 540 constituting the laminated thermoelectric conversion element 500, each of first electrodes 10A and 20B is provided between each first laminate 510 or 511 and each second insulating plate 41.

In other words, each first laminate 511 disposed on the outer side is disposed so that each third striped surface 511C where the first electrodes 20A and 20B are provided faces inward and comes into contact with the adjacent second insulating layer 41. Therefore, each fourth striped surface 511D is exposed to the outer surface of the second laminate 540. On the fourth striped surfaces 511D, the external wiring portions 31 and 32 can be attached.

Therefore, all the first electrodes 20A and 20B are disposed inside the second laminate 540 and are not exposed to the atmosphere. Thus, the electrodes are prevented from being oxidized and the humidity resistance of the laminated thermoelectric conversion element 500 is thus improved. Due to the improvement in humidity resistance, ion migration that is likely to occur in a case where the electrodes are made of silver is effectively prevented.

In the laminated thermoelectric conversion element 500, the external wiring portions 31 and 32 and the second electrode 61 are provided on the outer surface of the second laminate 540. Together with the external wiring portions 31 and 32 and the second electrode 61, the entire second laminate 540 may be covered with an electrical insulating material (not shown). In this case, the humidity resistance of the laminated thermoelectric conversion element 500 can be further improved. Furthermore, in a case where the thermal conductivity of the electrical insulating material is low, a temperature difference between the high temperature side and the low temperature side of the laminated thermoelectric conversion element 500 can be further increased, and thus a larger electromotive force can be obtained.

(First Laminate)

Figure 24:
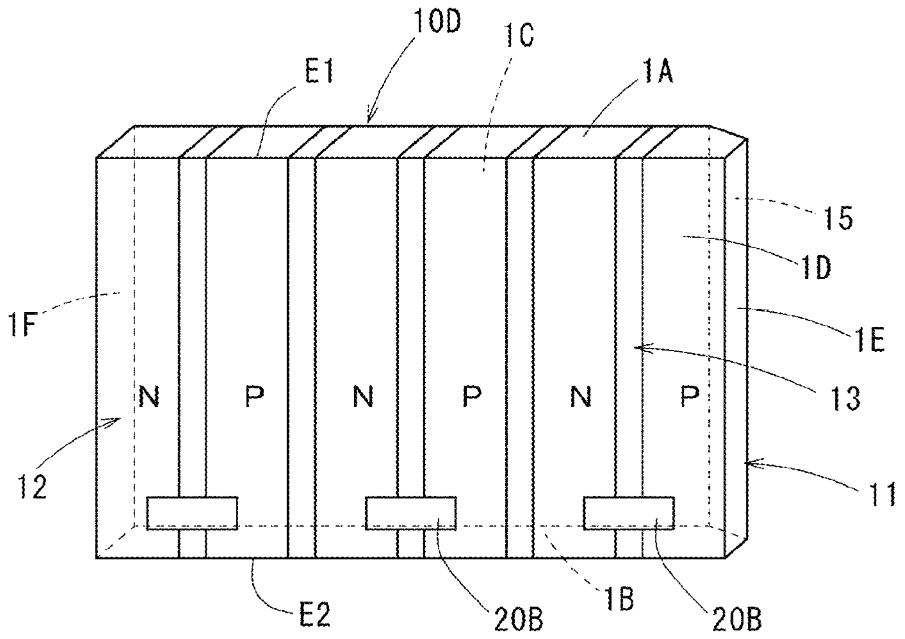
FIG. 24 is a perspective view showing a modification example of the first laminate of the laminated thermoelectric conversion element of FIG. 1.

The shape of the first laminate is not limited to the hexahedron, and the first laminate can also be configured as a polyhedron having seven or more surfaces. In the first laminate 10D shown in FIGS. 23 and 24, a chamfered portion 15 is provided along the longitudinal direction (direction in which a temperature difference occurs) of the P-type element (P-type layer 11) laminated at one end portion, and thus the first laminate 10D includes seven surfaces.

(Insulating Layer)

A side surface of the laminated thermoelectric conversion element may be covered with an insulating layer that insulates electricity and heat. In this case, in a case where a first electrode, a second electrode, and a third electrode are formed on the side surface, the first electrode, the second electrode, and the third electrode may also be covered with an insulating layer. Since the first electrode, the second electrode, and the third electrode are provided on the side surface, it is easy to perform a treatment for corrosion on the first electrode, the second electrode, and the third electrode.

EXAMPLES

Example 1

A thermoelectric conversion module 301 in which one laminated thermoelectric conversion element 4 was provided between a first plate-shaped portion 310 and a second plate-shaped portion 320 was produced, and an output voltage thereof was measured.

(1) Configuration of Thermoelectric Conversion Module 301

Figure 25:
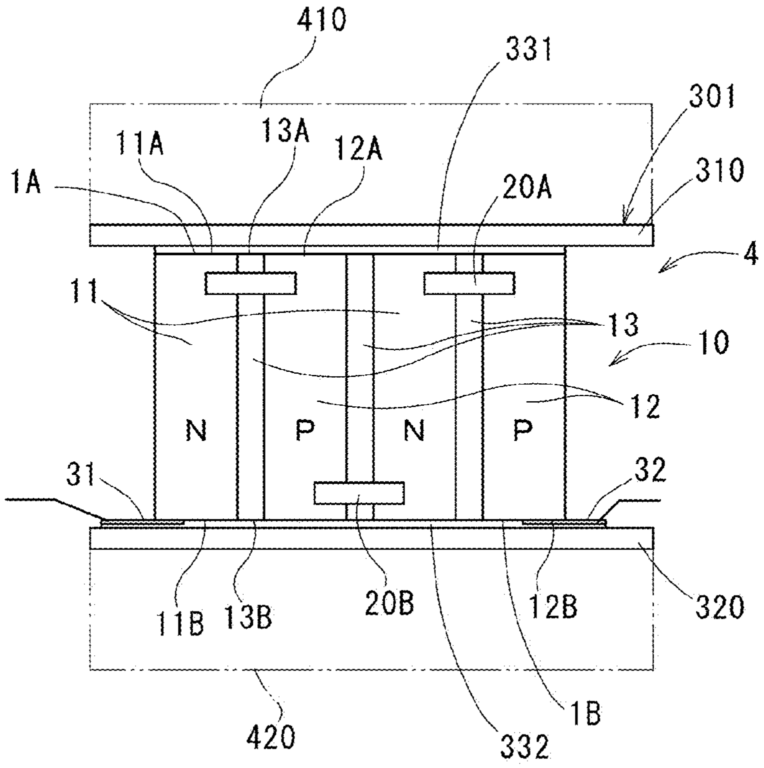
FIG. 25 is a front view showing a thermoelectric conversion module of Example 1.

As shown in FIG. 25, the laminated thermoelectric conversion element 4 has a laminated structure in which P-type layers 11 (P-type HH element: Sn 50 at %-Ni 25 at %-Zr 10 at %-Ti 15 at %) and N-type layers 12 (N-type HH element: Sb 45 at %-Fe 20 at %-Nb 25 at %-Ti 5 at %-V 5 at %) are alternately arranged and provided in a lamination direction with a first insulating layer 13 interposed between the P-type layer 11 and the N-type layer 12.

The P-type layer 11 and the N-type layer 12 each have a rectangular parallelepiped shape, and the sizes of end surfaces 11A, 11B, 12A, and 12B (see FIG. 2) are 3 mm in vertical direction, 3 mm in horizontal direction, and 5 mm in length.

A polyimide film (polyimide thickness 150 μm) having a adhesive component on both surfaces was used as the first insulating layer 13 to join the P-type layer 11 and the N-type layer 12, and thus a first laminate 10 was produced. The first laminate 10 has two pairs of the P-type layer 11 and the N-type layer 12 in the lamination direction.

As first electrodes 20A and 20B connecting the P-type layer 11 and the N-type layer 12, an Ag paste was applied to a third striped surface 1C of the first laminate 10 to form the first electrodes (upper first electrode 20A and lower first electrode 20B), and the P-type layers 11 and the N-type layers 12 were electrically connected in series alternately. In the first laminate 10 provided with the first electrodes 20A and 20B, extraction electrodes (external wiring portions 31 and 32) for extracting or applying a voltage were provided on an end surface 11B of the P-type layer 11 and an end surface 12B of the N-type layer 12, and Al conductive wires were attached to the extraction electrodes (external wiring portions 31 and 32) to produce the laminated thermoelectric conversion element 4.

A first striped surface 1A (end surface 11A of each P-type layer 11, end surface 12A of each N-type layer 12, end surface 13A of each first insulating layer 13) of the laminated thermoelectric conversion element 4 was joined to an inner surface of the first plate-shaped portion 310 through a second heat transfer layer 331, and similarly, a second striped surface 1B (end surface 11B of each P-type layer 11, end surface 12B of each N-type layer 12, end surface 13B of each first insulating layer 13) was joined to an inner surface of the second plate-shaped portion 320 through a second heat transfer layer 332 to provide the thermoelectric conversion module 301. As the second heat transfer layers 331 and 332, a polyimide film (polyimide thickness was 150 μm) having a pressure sensitive adhesive on both surfaces was used similarly to the first insulating layer 13. Ceramic substrates were used as the first plate-shaped portion 310 and the second plate-shaped portion 320.

(2) Methods for Measuring Physical Property Values

The magnitude of an output voltage of the laminated thermoelectric conversion element 4 in a case where a temperature difference was made between an upper portion and a lower portion of the thermoelectric conversion module 301 was measured. In this measurement, using a thermoelectric conversion efficiency evaluation device for a small module (Mini-PEM) manufactured by ADVANCE RIKO, Inc, a copper block 410 formed of copper was brought into contact with an outer surface of the first plate-shaped portion 310 of the thermoelectric conversion module 301, and a copper block 420 formed of copper was brought into contact with an outer surface of the second plate-shaped portion 320 to heat the copper block 410 on the high temperature side with a heater and keep the copper block 420 on the low temperature side at 35° C. with constant temperature circulating water.

Then, using a data logger manufactured by Graphtec Corporation, a temperature difference between the copper block 410 on the high temperature side and the copper block 420 on the low temperature side of the thermoelectric conversion module 301 was measured with a thermocouple, and the open circuit voltage of the laminated thermoelectric conversion element 4 was measured.

Figure 26:
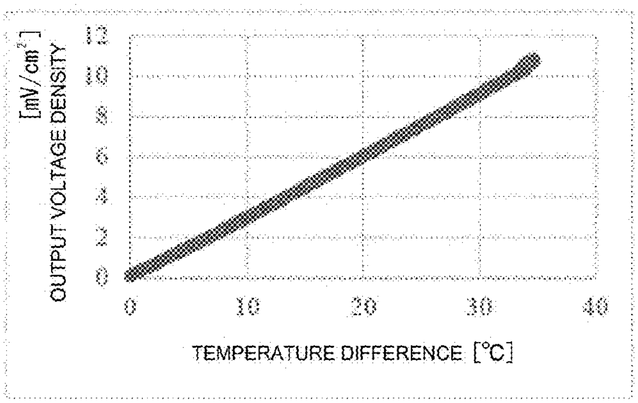
FIG. 26 is a graph showing the relationship between a temperature difference and an output voltage density in the thermoelectric conversion module of FIG. 25.

The measurement results are shown in FIG. 26. The horizontal axis indicates a temperature difference between the copper block 410 on the high temperature side and the copper block 420 on the low temperature side, and the vertical axis indicates an output voltage density. The output voltage density is an output voltage per unit area obtained by dividing the output voltage of the thermoelectric conversion module 301 by the area of the second plate-shaped portion 320 to which the laminated thermoelectric conversion element 4 and the extraction electrodes (external wiring portions 31 and 32) are joined.

The second plate-shaped portion 320 is formed to be larger than the second striped surface, and the area thereof is 0.42 $cm^2$ (0.3 cm in vertical direction, 1.4 cm in horizontal direction). This allows for joining of the plate-shaped electrodes (external wiring portions 31 and 32) for taking out the conductive wires attached to the second striped surface 1B of the laminated thermoelectric conversion element 4 and extending from the second striped surface 1B.

The larger the temperature difference, the higher the output voltage density. The output voltage density was approximately 9 $mV/cm^2$ in a case where the temperature difference was 30° C.

Example 2

In Example 2, a laminated thermoelectric conversion element 5 in which instead of the polyimide film of Example 1, an epoxy resin was used as the first insulating layer 13 was produced, and the output voltage of the laminated thermoelectric conversion element 5 was measured.

Figure 27:
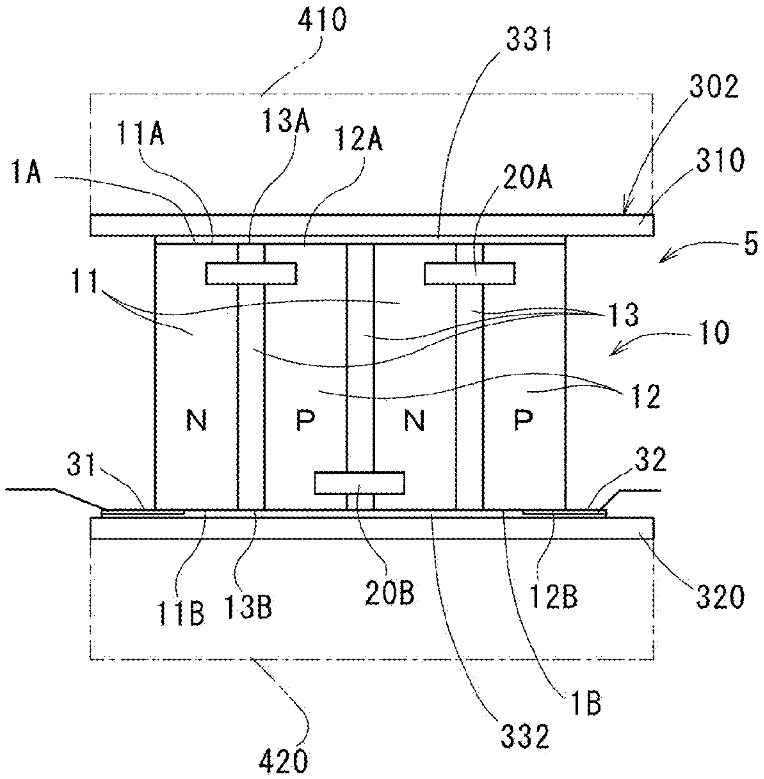
FIG. 27 is a front view showing a thermoelectric conversion module of Example 2.

For the laminated thermoelectric conversion element 5, only the material of the first insulating layer 13 was different, and as shown in FIG. 27, the constituent material and size of the P-type layer 11 (N-type layer 12), the placement and materials of the first electrodes 20A and 20B, the attachment of the Al conductive wires, the configurations of the first plate-shaped portion 310 and the second plate-shaped portion 320, and the like were the same as those in Example 1.

The thickness of the first insulating layer 13 (epoxy resin) is about several hundred μm. The first laminate 10 of Example 2 is provided with two pairs of the P-type layer 11 and the N-type layer 12 in the lamination direction.

The measurement method was also the same as in Example 1. Using a thermoelectric conversion efficiency evaluation device for a small module (Mini-PEM) manufactured by ADVANCE RIKO, Inc., a temperature difference was made between an upper portion and a lower portion of a thermoelectric conversion module 302, and the magnitude of an output voltage of the laminated thermoelectric conversion element 5 was measured using a data logger manufactured by Graphtec Corporation.

Figure 28:
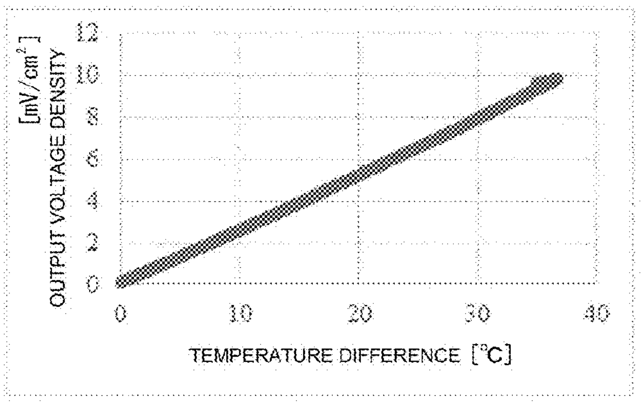
FIG. 28 is a graph showing the relationship between a temperature difference and an output voltage density in the thermoelectric conversion module of FIG. 27.

In FIG. 28, the horizontal axis indicates a temperature difference between the copper block 410 on the high temperature side (upper portion) and the copper block 420 on the low temperature side (lower portion), and the vertical axis indicates an output voltage (output voltage density) per unit area obtained by dividing the output voltage by the area (0.42 $cm^2$) of the second plate-shaped portion 320 to which the laminated thermoelectric conversion element 5 and the extraction electrodes (external wiring portions 31 and 32) are joined.

In the laminated thermoelectric conversion element 5, the larger the temperature difference, the higher the output voltage density. The output voltage density was approximately 8 $mV/cm^2$ in a case where the temperature difference was 30° C.

Comparative Example

Figure 29:
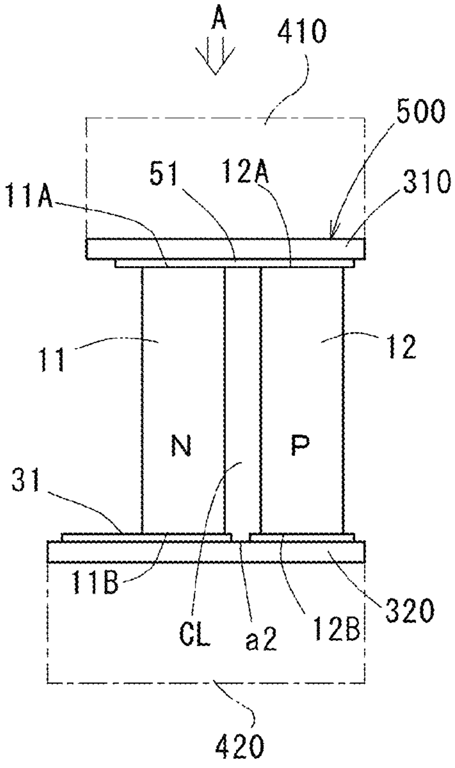
FIG. 29 is a front view showing a thermoelectric conversion module of Comparative Example.
Figure 30:
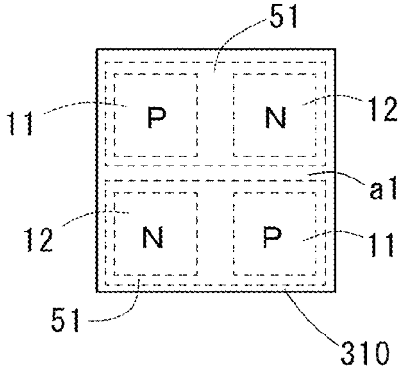
FIG. 30 is a diagram for describing a configuration of the thermoelectric conversion module of FIG. 29.
Figure 31:
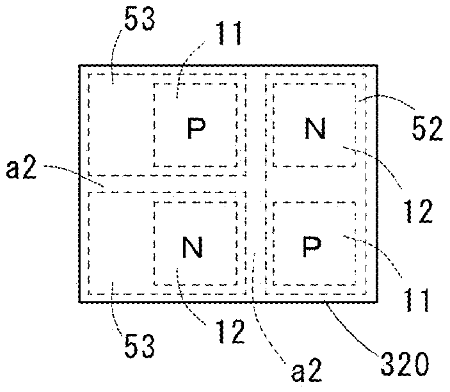
FIG. 31 is a diagram for describing a configuration of the thermoelectric conversion module of FIG. 29.

In a thermoelectric conversion module 500 of Comparative Example, as shown in FIGS. 29 to 31, two pairs of a P-type layer 11 and an N-type layer 12 having a gap CL interposed therebetween, that is, an insulating layer formed of an air layer are provided between a first plate-shaped portion 310 and a second plate-shaped portion 320.

FIG. 30 is a view of the thermoelectric conversion module 500 taken along an arrow A of FIG. 29, which shows a connection structure of the P-type layer 11 and the N-type layer 12 on the first plate-shaped portion 310 side. Similarly, FIG. 31 is a view of the thermoelectric conversion module 500 taken along the arrow A of FIG. 29, which shows a connection structure of the P-type layer 11 and the N-type layer 12 on the second plate-shaped portion 320 side.

The same P-type layer 11 and N-type layer 12 as in Examples 1 and 2 are used in Comparative Example. As shown in FIGS. 29 and 30, upper electrodes 51 are formed on an inner surface of the first plate-shaped portion 310, and end surfaces 11A of the P-type layers 11 and end surfaces 12A of the N-type layers 12 of the pairs are joined to the upper electrodes 51, respectively.

As shown in FIG. 31, lower electrodes 52 are formed on an inner surface of the second plate-shaped portion 320, and end surfaces 11B of the P-type layers 11 and end surfaces 12B of the N-type layers 12 of the adjacent pairs are joined to the lower electrodes 52, respectively. The P-type layers 11 and the N-type layers 12 are electrically connected in series alternately by a plurality of the upper electrodes 51 and the lower electrodes 52.

An uncovered surface a1 is provided between the upper electrodes 51 on the inner surface of the first plate-shaped portion 310, and an uncovered surface a2 is provided between the lower electrodes 52 on the inner surface of the second plate-shaped portion 320.

As the upper electrode 51 and the lower electrodes 52 and 53, a plate-shaped member of pure aluminum or an aluminum alloy is joined to an inner surface of a ceramic substrate as the first plate-shaped portion 310 and the second plate-shaped portion 320 by solid-phase diffusion.

The lower electrode 53 in which only one P-type layer 11 or N-type layer 12 is joined is provided to also function as an extraction electrode. Therefore, the lower second plate-shaped portion 320 is set to have larger dimensions than the upper first plate-shaped portion 310, and the area thereof is 1.5 $cm^2$ (1.0 cm in vertical direction, 1.5 cm in horizontal direction).

Regarding the thermoelectric conversion module 500, in the same method as in Examples 1 and 2, the magnitude of an output voltage in a case where a temperature difference was made between an upper portion and a lower portion of the thermoelectric conversion module 500 of Comparative Example using a thermoelectric conversion efficiency evaluation device for a small module (Mini-PEM) manufactured by ADVANCE RIKO, Inc. was measured using a data logger manufactured by Graphtec Corporation.

Figure 32:
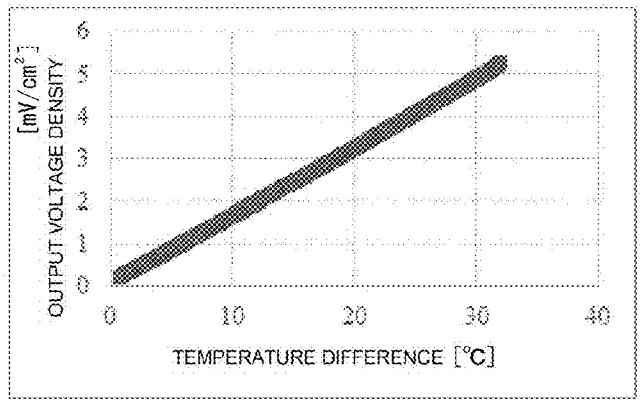
FIG. 32 is a graph showing the relationship between a temperature difference and an output voltage density in the thermoelectric conversion module of FIG. 29.

In FIG. 32, the horizontal axis indicates a temperature difference between a copper block 410 on the high temperature side (upper portion) and a copper block 420 on the low temperature side (lower portion), and the vertical axis indicates an output voltage (output voltage density) per unit area obtained by dividing the output voltage by the area (1.5 $cm^2$) of the second plate-shaped portion 320.

In the thermoelectric conversion module 500 of Comparative Example, the larger the temperature difference, the higher the output voltage density, and compared to the sum of the size of the joining surface of the lower electrode 52 relative to the second plate-shaped portion 320 and the space associated with electrode arrangement, the ratio of the areas of the end surfaces 12A and 12B of the mounted element is small, and thus it is found, even in a case where the temperature difference reaches 30° C., the output voltage density is approximately 5 $mV/cm^2$, which is lower than those of Examples of the present invention.

INDUSTRIAL APPLICABILITY

According to the present invention, a contact area of the thermoelectric conversion materials (P-type layer and N-type layer) relative to surfaces of objects (high temperature side, low temperature side) such as ceramic substrates is increased, so that a heat flow passing through the thermoelectric conversion materials (P-type layer and N-type layer) increases, and the output voltage density can be increased compared to the thermoelectric conversion module (FIG. 1 of PTL 1) of the related art.

In addition, in the I-type thermoelectric conversion module of the related art in which a gap is provided between electrodes on a high temperature-side substrate, a method for filling the gap with a resin has been proposed as a measure against corrosion of the electrode. However, in the laminated thermoelectric conversion element of the present invention, since the electrodes are provided on the side surface, a treatment for corrosion of the electrode is easily performed.

Furthermore, since the P-type layer and the N-type layer are laminated with the first insulating layer disposed therebetween, it is possible to prevent the P-type layer and the N-type layer from being peeled off.

REFERENCE SIGNS LIST

1, 2, 2A, 2B, 3, 4, 5, 500: Laminated Thermoelectric Conversion Element
1A: First Striped Surface
1B: Second Striped Surface
1C, 511C: Third Striped Surface
1D, 511D: Fourth Striped Surface
1E, 1F: Non-Striped Surface
10, 10A, 10B, 10C, 10D, 510, 511: First Laminate
11: P-Type Layer (P-Type Element)
11A, 11B, 11C, 11D: End Surface
110: P-Type Plate Material
12: N-Type Layer (N-Type Element)
12A, 12B, 12C, 12D: End Surface
120: N-Type Plate Material
13: First Insulating Layer
13A, 13B, 13C, 13D: End Surface
130: Sheet-Shaped Insulating Material Member
15: Chamfered Portion
20A, 20B: First Electrode
31, 32: External Wiring Portion
40, 540: Second Laminate
140: Third Laminate
240: Composite Body
40a: End Surface for High Temperature Side
40B: End Surface for Low Temperature Side
40C: First Side Surface
40D: Second Side Surface
40E: Third Side Surface
40F: Fourth Side Surface
41: Second Insulating Layer
42: First Heat Transfer Layer
61, 62: Second Electrode
81, 82: Third Electrode
200: Joined Body for Division
200A: Upper Surface
200B: Side Surface
201, 202: Electrode-Attached Joined Body for Division
300, 300a, 301, 302: Thermoelectric Conversion Module

310: First Plate-Shaped Portion

320: Second Plate-Shaped Portion

331, 332: Second Heat Transfer Layer

The invention claimed is:

1. A laminated thermoelectric conversion element comprising:

at least one first laminate in which at least one P-type layer formed of a P-type thermoelectric conversion material, at least one first insulating layer adjacent to the P-type layer, and at least one N-type layer formed of an N-type thermoelectric conversion material adjacent to the first insulating layer are laminated; and a first electrode that electrically connects the P-type layer and the N-type layer, wherein the first laminate has a plurality of striped surfaces where end surfaces of the P-type layer, the N-type layer, and the first insulating layer are arranged and exposed in stripes, one of the striped surfaces is set as a first striped surface for a high temperature side, a surface on an opposite side of the first striped surface is set as a second striped surface for a low temperature side, and two striped surfaces other than the first striped surface and the second striped surface are set as a third striped surface and a fourth striped surface, respectively, and the first electrode is provided on at least one of the third striped surface or the fourth striped surface.

2. The laminated thermoelectric conversion element according to claim 1, wherein in the first laminate, a plurality of the P-type layers and a plurality of the N-type layers are alternately laminated with the first insulating layer interposed therebetween, and a plurality of the first electrodes electrically connect the plurality of P-type layers and the plurality of N-type layers in series.

3. The laminated thermoelectric conversion element according to claim 2, wherein the plurality of first electrodes are provided on the third striped surface and the fourth striped surface.

4. The laminated thermoelectric conversion element according to claim 1, wherein a second laminate that includes a plurality of the first laminates arranged in a direction perpendicular to the third striped surface and a second insulating layer disposed between the plurality of first laminates, and a second electrode that is provided on a surface other than the striped surfaces of two first laminates adjacent to each other through the second insulating layer to connect the P-type layer of one of the two first laminates and the N-type layer of the other of the two first laminates are provided.

5. The laminated thermoelectric conversion element according to claim 1, wherein a third laminate in which a plurality of the first laminates arranged in a direction perpendicular to the first striped surface, and a first heat transfer layer that is disposed between the plurality of first laminates and that has electrical insulating properties are laminated is provided.

6. The laminated thermoelectric conversion element according to claim 1, wherein the laminated thermoelectric conversion element has a rectangular parallelepiped shape, and the first striped surface and the second striped surface are orthogonal to the third striped surface.

7. The laminated thermoelectric conversion element according to claim 1, wherein a thickness of the first insulating layer in a lamination direction is 500 μm or less.

8. The laminated thermoelectric conversion element according to claim 1, wherein a thickness of the first insulating layer in a lamination direction is equal to or less than half of an average value of thicknesses of the P-type layer and the N-type layer in the lamination direction.

9. The laminated thermoelectric conversion element according to claim 1, wherein the first insulating layer is any one of a resin, ceramics, or glass.

10. The laminated thermoelectric conversion element according to claim 1, wherein a second heat transfer layer having electrical insulating properties is disposed on the first striped surface and the second striped surface.

11. The laminated thermoelectric conversion element according to claim 4, wherein in the second laminate, the first electrode is disposed between a first laminate and the second insulating layer.

12. The laminated thermoelectric conversion element according to claim 4, further comprising:

an insulating coating that covers the second laminate and the second electrode.

13. A method for manufacturing the laminated thermoelectric conversion element according to claim 1, the method comprising:

a laminate formation step of forming the first laminate by laminating a P-type plate material formed of the P-type thermoelectric conversion material, the first insulating layer adjacent to the P-type plate material, and an N-type plate material formed of the N-type thermoelectric conversion material and adjacent to the first insulating layer; and a first electrode formation step of providing the first electrode on the third striped surface of the first laminate.

14. A method for manufacturing the laminated thermoelectric conversion element according to claim 1, the method comprising:

a joined body for division formation step of forming a joined body for division by laminating a P-type plate material formed of the P-type thermoelectric conversion material, the first insulating layer adjacent to the P-type plate material, and an N-type plate material formed of the N-type thermoelectric conversion material and adjacent to the first insulating layer;

a first electrode formation step of forming an electrode-attached joined body for division by forming a plurality of first electrodes ranging from the P-type plate material to the N-type plate material on a side surface of the joined body for division where the P-type layer, the first insulating layer, and the N-type layer are exposed; and a division step of dividing the electrode-attached joined body for division to manufacture a plurality of the first laminates including the first electrodes.

15. A method for manufacturing the laminated thermoelectric conversion element according to claim 14, wherein in the division step, the first electrodes are cut together with the electrode-attached joined body for division.

16. The laminated thermoelectric conversion element according to claim 2, wherein a second laminate that includes a plurality of the first laminates arranged in a direction perpendicular to the third striped surface and a second insulating layer disposed between the plurality of first laminates, and a second electrode that is provided on a surface other than the striped surfaces of two first laminates adjacent to each other through the second insulating layer to connect the P-type layer of one of the two first laminates and the N-type layer of the other of the two first laminates are provided.

17. The laminated thermoelectric conversion element according to claim 2, wherein a third laminate in which a plurality of the first laminates arranged in a direction perpendicular to the first striped surface, and a first heat transfer layer that is disposed between the plurality of first laminates and that has electrical insulating properties are laminated is provided.

18. The laminated thermoelectric conversion element according to claim 2, wherein the laminated thermoelectric conversion element has a rectangular parallelepiped shape, and the first striped surface and the second striped surface are orthogonal to the third striped surface.

19. A method for manufacturing the laminated thermoelectric conversion element according to claim 2, the method comprising:

a laminate formation step of forming the first laminate by laminating a P-type plate material formed of the P-type thermoelectric conversion material, the first insulating layer adjacent to the P-type plate material, and an N-type plate material formed of the N-type thermoelectric conversion material and adjacent to the first insulating layer; and a first electrode formation step of providing the first electrode on the third striped surface of the first laminate.

20. A method for manufacturing the laminated thermoelectric conversion element according to claim 2, the method comprising:

a joined body for division formation step of forming a joined body for division by laminating a P-type plate material formed of the P-type thermoelectric conversion material, the first insulating layer adjacent to the P-type plate material, and an N-type plate material formed of the N-type thermoelectric conversion material and adjacent to the first insulating layer;

a first electrode formation step of forming an electrode-attached joined body for division by forming a plurality of first electrodes ranging from the P-type plate material to the N-type plate material on a side surface of the joined body for division where the P-type layer, the first insulating layer, and the N-type layer are exposed; and a division step of dividing the electrode-attached joined body for division to manufacture a plurality of the first laminates including the first electrodes.

* * * * *